(12) United States Patent
Jeong et al.

(10) Patent No.: US 10,644,069 B2
(45) Date of Patent: May 5, 2020

(54) MEMORY DEVICES HAVING CROSSPOINT MEMORY ARRAYS THEREIN WITH MULTI-LEVEL WORD LINE AND BIT LINE STRUCTURES

(71) Applicant: Samsung Electronics Co., Ltd., Suwon-si, Gyeonggi-do (KR)

(72) Inventors: Ji-Hyun Jeong, Hwaseong-si (KR); Dae-Hwan Kang, Seoul (KR); Du-Eung Kim, Yongin-si (KR); Kwang-Jin Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/135,315

(22) Filed: Sep. 19, 2018

(65) Prior Publication Data

US 2019/0140022 A1   May 9, 2019

(30) Foreign Application Priority Data

Nov. 9, 2017   (KR) .......................... 10-2017-0148719

(51) Int. Cl.
*G11C 5/06* (2006.01)
*H01L 27/24* (2006.01)
(Continued)

(52) U.S. Cl.
CPC .......... *H01L 27/2481* (2013.01); *G11C 5/063* (2013.01); *G11C 11/161* (2013.01); *G11C 11/1655* (2013.01); *G11C 11/1657* (2013.01); *G11C 13/0026* (2013.01); *G11C 13/0028* (2013.01); *H01L 27/224* (2013.01); *H01L 27/228* (2013.01); *H01L 27/2427* (2013.01); *H01L 45/04* (2013.01); *H01L 45/06* (2013.01); *H01L 45/08* (2013.01); *H01L 45/126* (2013.01);
(Continued)

(58) Field of Classification Search
CPC . G11C 5/063; G11C 11/1655; G11C 11/1657; G11C 13/0026; G11C 13/0028
See application file for complete search history.

(56) References Cited

U.S. PATENT DOCUMENTS 7,858,468 B2 * 12/2010 Liu ..................... H01L 27/2409
                                                                    257/379
7,943,515 B2    5/2011 Scheuerlein
(Continued)

FOREIGN PATENT DOCUMENTS

KR    10-2011-0072025    6/2011
KR    10-2011-0096975    8/2011

*Primary Examiner* — Pho M Luu
(74) *Attorney, Agent, or Firm* — Myers Bigel, P.A.

(57) ABSTRACT

A memory device includes a first word line extending in a first direction on a substrate, a first bit line extending in a second direction on the first word line, a first memory cell disposed between the first word line and the first bit line, a second word line extending in the first direction on the first bit line, a second bit line extending in the second direction on the second word line, a second memory cell disposed between the second word line and the second bit line, and a first bit line connection structure connected to the first bit line and the second bit line. The first bit line connection structure includes a first bit line contact connected to the first bit line and a second bit line contact, which is connected to the second bit line and vertically overlaps the first bit line contact.

20 Claims, 26 Drawing Sheets

(51) Int. Cl.
*G11C 13/00* (2006.01)
*H01L 27/22* (2006.01)
*G11C 11/16* (2006.01)
*H01L 45/00* (2006.01)

(52) U.S. Cl.
CPC ........ *H01L 45/1233* (2013.01); *H01L 45/143* (2013.01); *H01L 45/144* (2013.01); *H01L 45/146* (2013.01); *H01L 45/148* (2013.01); *G11C 13/0004* (2013.01); *G11C 2213/71* (2013.01)

(56) References Cited

U.S. PATENT DOCUMENTS

| | | | |
|---|---|---|---|
| 8,467,214 B2* | 6/2013 | Funane | G11C 8/16 |
| | | | 365/51 |
| 8,735,861 B2* | 5/2014 | Noda | H01L 45/04 |
| | | | 257/2 |
| 9,520,186 B2* | 12/2016 | Kim | G11C 13/0002 |
| 2011/0147690 A1 | 6/2011 | Yang | |
| 2015/0070960 A1 | 3/2015 | Castro et al. | |

* cited by examiner

MEMORY DEVICES HAVING CROSSPOINT MEMORY ARRAYS THEREIN WITH MULTI-LEVEL WORD LINE AND BIT LINE STRUCTURES

REFERENCE TO PRIORITY APPLICATION

This application claims the benefit of Korean Patent Application No. 10-2017-0148719, filed Nov. 9, 2017, in the Korean Intellectual Property Office, the disclosure of which is incorporated herein in its entirety by reference.

BACKGROUND

The inventive concept relates to a memory device, and more particularly, to a memory device having a crosspoint array structure.

With the lightening, thinning, shortening and miniaturizing trend of electronic products, the demand for highly integrated memory devices is increasing. Also, memory devices having a three-dimensional (3D) crosspoint structure, where a memory cell is located at a crosspoint between two crossing electrodes have been proposed. However, as a degree of integration of memory devices having a crosspoint structure increases continuously, electrical characteristic differences caused by the positions of individual memory units configuring each of the memory devices may occur.

SUMMARY

The inventive concept provides a memory device of a crosspoint array type having highly uniform operating characteristics among the memory units therein.

According to an embodiment of the inventive concept, there is provided a memory device including a first word line extending in a first direction on a substrate, a first bit line on the first word line, the first bit line extending in a second direction perpendicular to the first direction, and a first memory cell between the first word line and the first bit line. The first memory cell includes a first memory unit and a first switching unit. Also provided is a second word line on the first bit line (the second word line extending in the first direction), a second bit line on the second word line (the second bit line extending in the second direction), and a second memory cell extending between the second word line and the second bit line. The second memory cell includes a second memory unit and a second switching unit. A first bit line connection structure is provided, which is connected to the first bit line and the second bit line. This first bit line connection structure includes a first bit line contact connected to the first bit line and a second bit line contact connected to the second bit line and disposed to vertically overlap the first bit line contact.

According to another embodiment of the inventive concept, there is provided a memory device including a plurality of first word lines extending in a first direction on a substrate, a plurality of first bit lines on the plurality of first word lines, the plurality of first bit lines extending in a second direction perpendicular to the first direction, and a plurality of first memory cells between the plurality of first word lines and the plurality of first bit lines. Each of the plurality of first memory cells includes a first memory unit and a first switching unit. A plurality of second word lines (extending in the first direction) are provided on the plurality of first bit lines, and a plurality of second bit lines (extending in the second direction) are provided on the plurality of second word lines. A plurality of second memory cells are provided between the plurality of second word lines and the plurality of second bit lines. Each of the plurality of second memory cells includes a second memory unit and a second switching unit. A plurality of first bit line connection structures are provided, which are electrically connected to the plurality of first bit lines and the plurality of second bit lines. At least a portion of each of the plurality of first bit line connection structures is disposed between a corresponding first bit line of the plurality of first bit lines and a corresponding second bit line of the plurality of second bit lines.

According to another embodiment of the inventive concept, there is provided a memory device including a first word line extending in a first direction on a substrate, a first bit line on the first word line, the first bit line extending in a second direction perpendicular to the first direction, and a first memory cell between the first word line and the first bit line. The first memory cell includes a first memory unit and a first switching unit. A second word line (extending in the first direction) is provided on the first bit line, and a second bit line (extending in the second direction) is provided on the second word line. A second memory cell is provided, between the second word line and the second bit line. The second memory cell includes a second memory unit and a second switching unit. A first bit line connection structure is provided, which includes a first bit line contact disposed underneath the first bit line and a second bit line contact, which is disposed between the first bit line and the second bit line and vertically overlaps the first bit line contact.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, exemplary embodiments will be described in detail with reference to the accompanying drawings.

Figure 1:
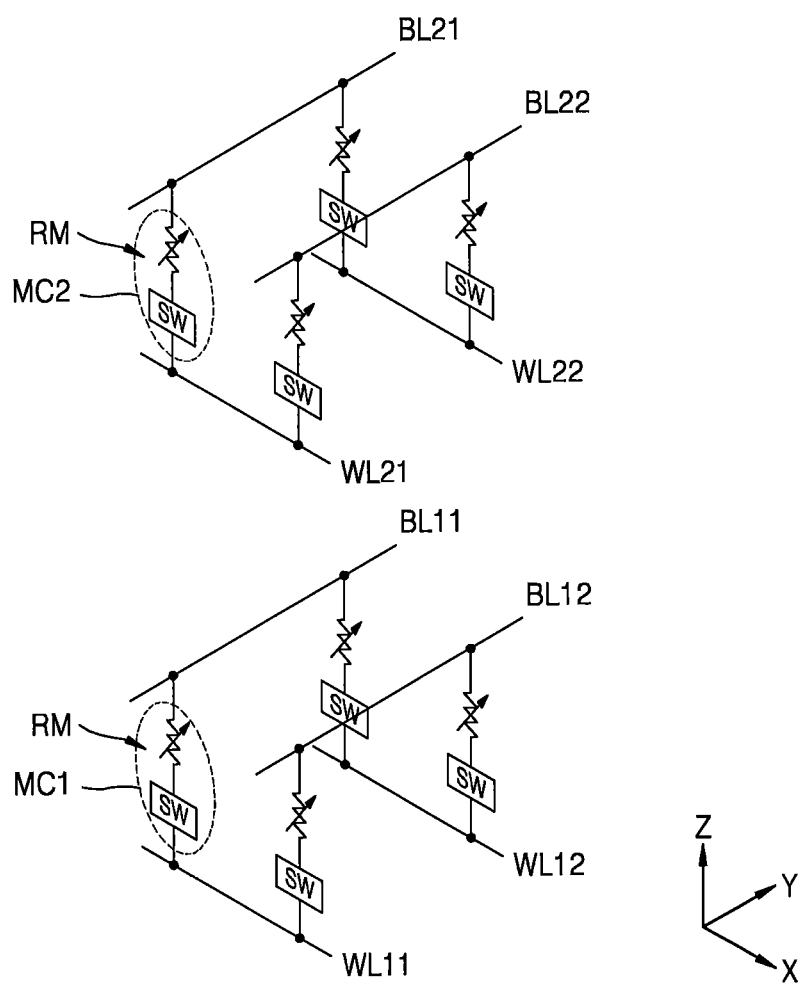
FIG. 1 is an equivalent circuit diagram of a memory device according to exemplary embodiments.

FIG. 1 is an equivalent circuit diagram of a memory device 10 according to exemplary embodiments. Referring to FIG. 1, the memory device 10 may include a plurality of bottom word lines WL11 and WL12, which extend in a first direction (i.e., an X direction of FIG. 1) and are spaced apart from each other in a second direction (i.e., a Y direction of FIG. 1) perpendicular to the first direction, and a plurality of top word lines WL21 and WL22 which extend in the first direction and are spaced apart from each other in the second direction over the bottom word lines WL11 and WL12. Also, the memory device 10 may include a plurality of bottom bit lines BL11 and BL12, which extend in the second direction and are spaced apart from the top word lines WL21 and WL22 in a third direction (i.e., a Z direction of FIG. 1) perpendicular to the first direction and the second direction, and a plurality of top bit lines BL21 and BL22 which extend in the second direction and are spaced apart from each other in the first direction over the bottom bit lines BL11 and BL12.

A first memory cell MC1 may be disposed between the bottom bit lines BL11 and BL12 and the bottom word lines WL11 and WL12, and a second memory cell MC2 may be disposed between the top bit lines BL21 and BL22 and the top word lines WL21 and WL22. In detail, the first and second memory cells MC1 and MC2 may each include a variable resistance material layer RM for storing information and a switching device SW for selecting a memory cell. Also, the switching device SW may be referred to as a selection device or an access device.

The first memory cell MC1 between the bottom bit lines BL11 and BL12 and the bottom word lines WL11 and WL12 and the second memory cell MC2 between the top bit lines BL21 and BL22 and the top word lines WL21 and WL22 may be disposed to have the same structure in the third direction. As exemplarily illustrated in FIG. 1, in the first memory cell MC1, the variable resistance material layer RM may be connected to the bottom bit lines BL11 and BL12, the switching device SW may be connected to the bottom word lines WL11 and WL12, and the variable resistance material layer RM and the switching device SW may be serially connected to each other. Also, in the second memory cell MC2, the variable resistance material layer RM may be connected to the top bit lines BL21 and BL22, the switching device SW may be connected to the top word lines WL21 and WL22, and the variable resistance material layer RM and the switching device SW may be serially connected to each other.

However, the inventive concept is not limited thereto. In other embodiments, unlike the illustration of FIG. 1, in each of the first memory cell MC1 and the second memory cell MC2, the switching device SW and the variable resistance material layer RM may be switched in their disposed positions. For example, in the first memory cell MC1, the variable resistance material layer RM may be connected to the bottom word lines WL11 and WL12, and the switching device SW may be connected to the bottom bit lines BL11 and BL12. Also, in the second memory cell MC2, the variable resistance material layer RM may be connected to the top word lines WL21 and WL22, and the switching device SW may be connected to the top bit lines BL21 and BL22.

Hereinafter, a driving method of the memory device 10 will be described. For example, a voltage may be applied to the variable resistance material layer RM of the first memory cell MC1 or the second memory cell MC2 through the word lines WL11, WL12, WL21, and WL22 and the bit lines BL11, BL12, BL21, and BL22, and thus, a current may flow in the variable resistance material layer RM. For example, the variable resistance material layer RM may include a "non-volatile" phase change material layer which is reversibly shifted between a first state and a second state. However, the variable resistance material layer RM is not limited thereto. In other embodiments, the variable resistance material layer RM may include an arbitrary variable resistor having a resistance value that varies according to a voltage applied thereto. For example, in the first and second memory cells MC1 and MC2 which are selected, a resistance of the variable resistance material layer RM may be reversibly shifted between the first state and the second state according to a voltage applied to the variable resistance material layer RM.

Based on a resistance change of the variable resistance material layer RM, the first and second memory cells MC1 and MC2 may store digital information such as 0 or 1, and the digital information may be erased from the first and second memory cells MC1 and MC2. For example, data may be written as a high resistance state "0" and a low resistance state "1" in the first and second memory cells MC1 and MC2. Here, writing from the high resistance state "0" to the low resistance state "1" may be referred to as a set operation, and writing from the low resistance state "1" to the high resistance state "0" may be referred to as a reset operation. However, digital data stored in the first and second memory cells MC1 and MC2 according to an embodiment is not limited to the high-resistance state "0" and the low-resistance state "1", but various resistance states may be stored in the first and second memory cells MC1 and MC2.

Arbitrary memory cells MC1 and MC2 may be addressed by selecting the word lines WL11, WL12, WL21, and WL22 and the bit lines BL11, BL12, BL21, and BL22, may be programmed by applying a certain signal between the word lines WL11, WL12, WL21, and WL22 and the bit lines BL11, BL12, BL21, and BL22, and information based on a resistance value of a variable resistor configuring each of the arbitrary memory cells MC1 and MC2 may be read out by measuring a current value through the bit lines BL11, BL12, BL21, and BL22.

According to exemplary embodiments, the first memory cell MC1, which is disposed between the bottom bit lines BL11 and BL12 and the bottom word lines WL11 and WL12, may be provided to have the same structure as that of the second memory cell MC2, which is disposed between the top bit lines BL21 and BL22 and the top word lines WL21 and WL22. Therefore, the first memory cell MC1 may have the same electrical characteristic (for example, a read current, a write current, or a threshold voltage) as that of the second memory cell MC2, and thus, an electrical characteristic difference may not occur between the first memory cell MC1 and the second memory cell MC2.

Figure 2:
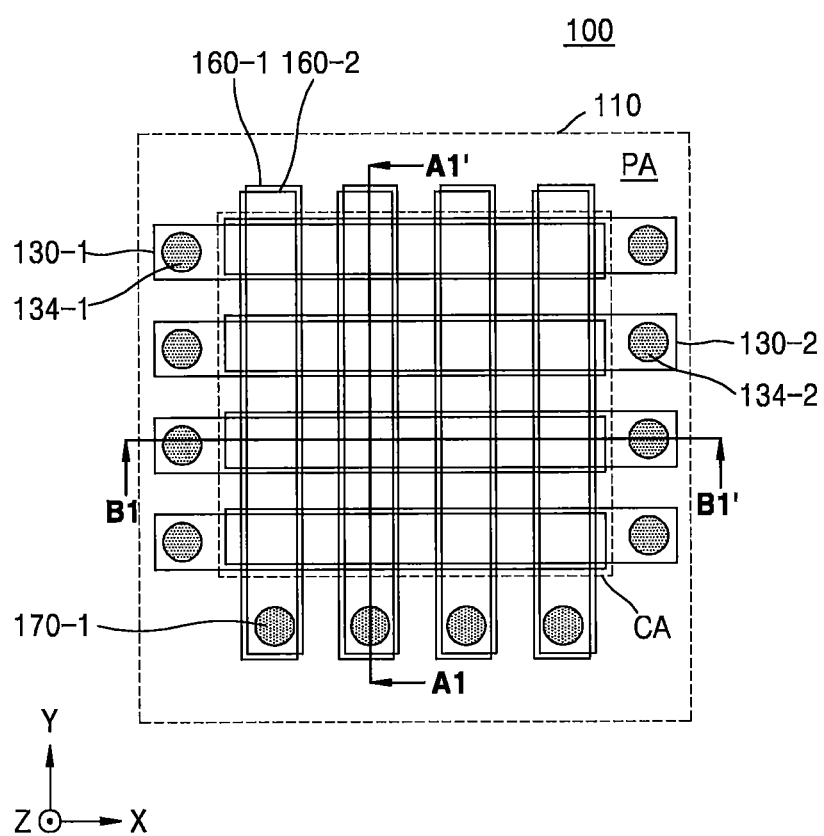
FIG. 2 is a layout diagram illustrating a representative configuration of a memory device according to exemplary embodiments.
Figure 3:
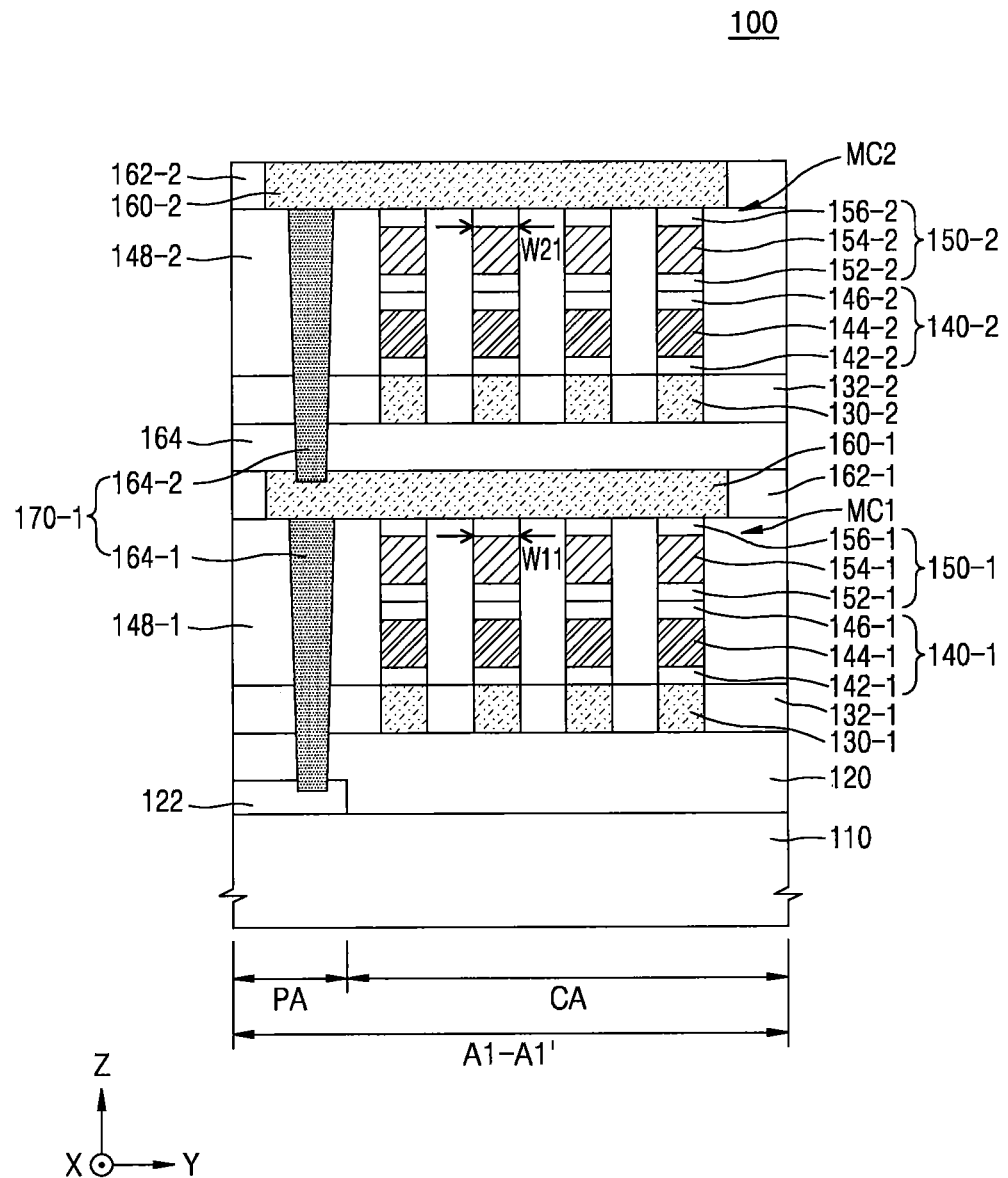
FIG. 3 is a cross-sectional view taken along line A1-A1' of FIG. 2.
Figure 4:
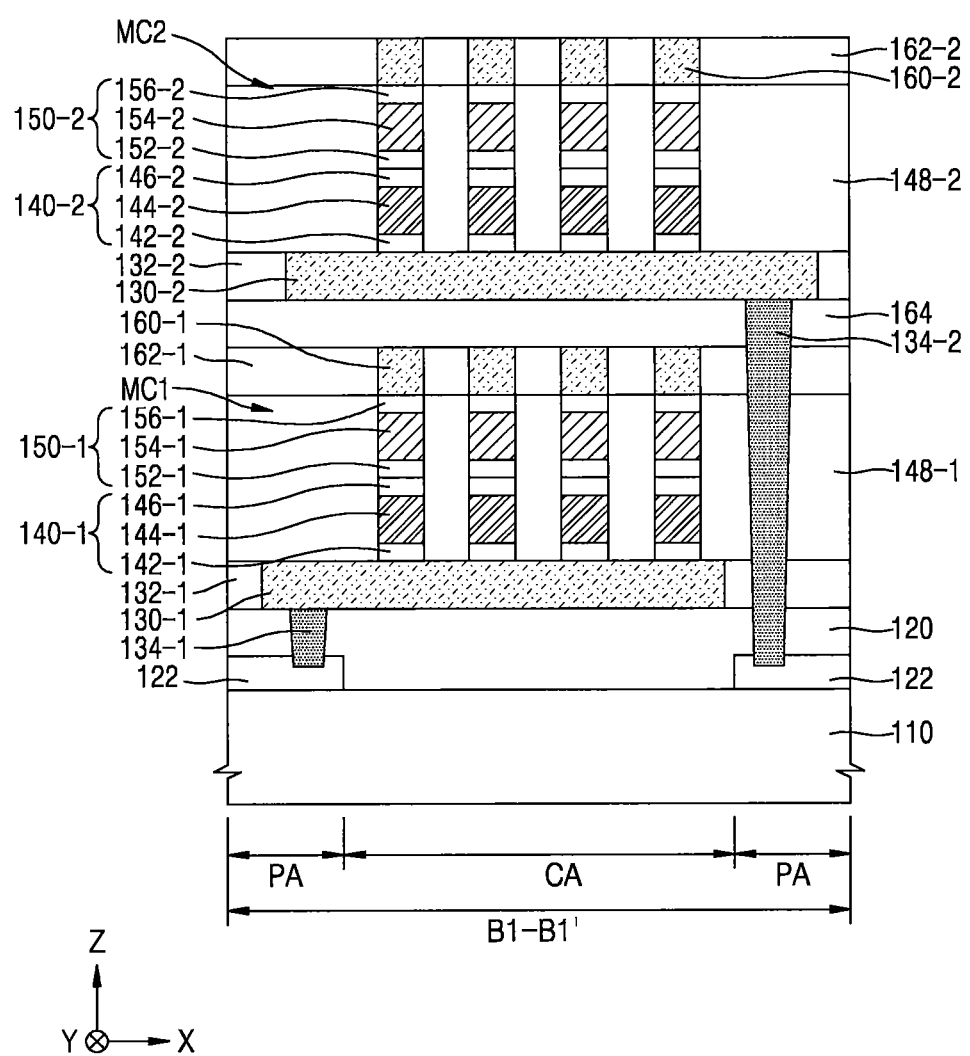
FIG. 4 is a cross-sectional view taken along line B1-B1' of FIG. 2.

FIG. 2 is a layout diagram illustrating a representative configuration of a memory device 100 according to exemplary embodiments, FIG. 3 is a cross-sectional view taken along line A1-A1' of FIG. 2, and FIG. 4 is a cross-sectional view taken along line B1-B1' of FIG. 2. Referring to FIGS. 2 to 4, the memory device 100 may include a plurality of first word lines 130-1, a plurality of first bit lines 160-1, a plurality of second word lines 130-2, a plurality of second bit lines 160-2, a plurality of first memory cells MC1, and a plurality of second memory cells MC2 which are disposed on a substrate 110, first and second word line contacts 134-1 and 134-2, and a first bit line connection structure 170-1.

The substrate 110 may include a memory cell array area CA and a wiring connection area PA. For example, as seen in a plan view, the memory cell array area CA may be disposed in a center of the substrate 110, and the wiring connection area PA may be disposed outside the memory cell array area CA. The plurality of first memory cells MC1 and the plurality of second memory cells MC2 may be disposed in the memory cell array area CA. The first and second word line contacts 134-1 and 134-2 and the first bit line connection structure 170-1 may be disposed in the wiring connection area PA. For example, the plurality of first memory cells MC1 and the plurality of second memory cells MC2 are disposed opposite the memory cell array area CA and the first bit line connection structure 170-1 may be disposed opposite the wiring connection area PA.

A first insulating interlayer 120 may be disposed on the substrate 110. The first insulating interlayer 120 may include oxide, such as silicon oxide or the like, or nitride such as silicon nitride or the like. A lower wiring layer 122 may be provided on the substrate 110, and the first insulating interlayer 120 may cover the lower wiring layer 122. In FIG. 3, the lower wiring layer 122 is illustrated as being directly disposed on the substrate 110, but is not limited thereto. In other embodiments, a portion of the first insulating interlayer 120 may be disposed between the substrate 110 and the lower wiring layer 122, and thus, the lower wiring layer 122 may not directly contact the substrate 110.

The plurality of first word lines 130-1 may extend in a first direction (an X direction) on the first insulating interlayer 120. The plurality of first bit lines 160-1 may extend in a second direction (a Y direction) on the plurality of first word lines 130-1. The plurality of second word lines 130-2 may extend in the first direction (the X direction) at a level which is higher than the plurality of first bit lines 160-1. The plurality of second bit lines 160-2 may extend in the second direction (the Y direction) on the plurality of second word lines 130-2.

The plurality of first word lines 130-1, the plurality of first bit lines 160-1, the plurality of second word lines 130-2, and the plurality of second bit lines 160-2 may each include metal, conductive metal nitride, conductive metal oxide, or a combination thereof. For example, the plurality of first word lines 130-1, the plurality of first bit lines 160-1, the plurality of second word lines 130-2, and the plurality of second bit lines 160-2 may each include tungsten (W), tungsten nitride (WN), gold (Au), silver (Ag), copper (Cu), aluminium (Al), titanium aluminium nitride (TiAlN), iridium (Ir), platinum (Pt), palladium (Pd), ruthenium (Ru), zirconium (Zr), rhodium (Rh), nickel (Ni), cobalt (Co), chromium (Cr), tin (Sn), zinc (Zn), indium tin oxide (ITO), an alloy thereof, or any combination thereof. Also, the plurality of first word lines 130-1, the plurality of first bit lines 160-1, the plurality of second word lines 130-2, and the plurality of second bit lines 160-2 may each include a metal layer and a conductive barrier layer covering at least a portion of the metal layer. The conductive barrier layer may be formed of titanium (Ti), titanium nitride (TiN), tantalum (Ta), tantalum nitride (TaN), or a combination thereof, for example.

The plurality of first memory cells MC1 may each be disposed between a corresponding first word line of the plurality of first word lines 130-1 and a corresponding first bit line of the plurality of first bit lines 160-1. Similarly, the plurality of second memory cells MC2 may each be disposed between a corresponding second word line of the plurality of second word lines 130-2 and a corresponding second bit line of the plurality of second bit lines 160-2. In exemplary embodiments, the plurality of first memory cells MC1 and the plurality of second memory cells MC2 may be provided in a pillar structure having a tetragonal (e.g., square, rectangular) pillar shape. Alternatively, the plurality of first memory cells MC1 and the plurality of second memory cells MC2 may have various pillar shapes such as a circular pillar, an elliptical pillar, a polygonal pillar, hexagonal pillar, etc. In addition, each of the plurality of first memory cells MC1 may include a first switching unit 140-1 disposed on a corresponding first word line of the plurality of first word lines 130-1 and a first memory unit 150-1 disposed on the first switching unit 140-1. Each of the plurality of second memory cells MC2 may include a second switching unit 140-2 disposed on a corresponding second word line of the plurality of second word lines 130-2 and a second memory unit 150-2 disposed on the second switching unit 140-2.

The first switching unit 140-1 may include a first electrode layer 142-1, a first switching material layer 144-1, and a second electrode layer 146-1 which are sequentially stacked on each of the plurality of first word lines 130-1. The first switching material layer 144-1 may be a current control layer for controlling a flow of a current. The first switching material layer 144-1 may include a material layer having a resistance which varies according to a level of a voltage applied across both ends of the first switching material layer 144-1. For example, the first switching material layer 144-1 may include a material layer having an ovonic threshold switching (OTS) characteristic. To briefly describe a function of the first switching material layer 144-1 based on an OTS material layer, when a voltage lower than a threshold voltage is applied to the first switching material layer 144-1, the first switching material layer 144-1 may be in the high resistance state where a current hardly flows, and when a voltage higher than the threshold voltage is applied to the first switching material layer 144-1, the first switching material layer 144-1 may be in the low resistance state and thus a current may start to flow. Also, when the current flowing through the first switching material layer 144-1 becomes lower than a holding current, the first switching material layer 144-1 may be changed to the high resistance state.

The first switching material layer 144-1 may include a chalcogenide material as an OTS material layer. In exemplary embodiments, the first switching material layer 144-1 may include Si, Te, As, Ge, In, or a combination thereof. For example, a composition of the first switching material layer 144-1 may include about 14% Si, about 39% Te, about 37% As, about 9% Ge, and about 1% In. Here, a percentage ratio denotes an atomic percentage ratio where an atomic element is a total of 100%, and the same hereinafter. In other embodiments, the first switching material layer 144-1 may include Si, Te, As, Ge, S, Se, or a combination thereof. For example, the first switching material layer 144-1 may include about 5% Si, about 34% Te, about 28% As, about 11% Ge, about 21% S, and about 1% Se. In other embodiments, the first switching material layer 144-1 may include Si, Te, As, Ge, S, Se, Sb, or a combination thereof. For example, the first switching material layer 144-1 may include about 21% Te, about 10% As, about 15% Ge, about 2% S, about 50% Se, and about 2% Sb.

In the memory device 100 according to the present embodiment, the first switching material layer 144-1 is not limited to the OTS material layer. For example, the first switching material layer 144-1 may include various material layers having a function of selecting devices without being limited to the OTS material layer. For example, the first switching material layer 144-1 may include a diode, tunnel junction, a PNP diode or a bipolar junction transistor (BJT), mixed ionic-electronic conduction (MIEC), etc.

The first electrode layer 142-1 and the second electrode layer 146-1 may each be a layer that functions as a current path, and may each include a conductive material. For example, each of the first electrode layer 142-1 and the second electrode layer 146-1 may include metal, conductive metal nitride, conductive metal oxide, or a combination thereof. For example, each of the first electrode layer 142-1 and the second electrode layer 146-1 may include a TiN layer, but is not limited thereto.

The first memory unit 150-1 may include a third electrode layer 152-1, a first variable resistance layer 154-1, and a fourth electrode layer 156-1 which are sequentially stacked on the first switching unit 140-1.

In exemplary embodiments, the first variable resistance layer 154-1 may include a phase change material which is reversibly changed between a crystalline state and an amorphous state according to a heating period. For example, the first variable resistance layer 154-1 may include a material that has a phase, reversibly changed by Joule heat which is generated by a voltage applied across both ends of the first variable resistance layer 154-1, and a resistance changed by the phase change. In detail, the phase change material may be put in a high resistance state in amorphous phase and may be put in a low resistance state in crystalline phase. The high resistance state may be defined as 0, and the low resistance state may be defined as 1, whereby data may be stored in the first variable resistance layer 154-1.

In embodiments, the first variable resistance layer 154-1 may include one or more elements (a chalcogen element) from Group VI in the periodic table and may optionally include one or more chemical modifiers from Group III, IV or V. For example, the first variable resistance layer 154-1 may include Ge—Sb—Te. Here, a chemical composition mark including hyphens (-) may represent a certain compound or an element included in a compound and may represent all chemical formula structures including a represented element. For example, Ge—Sb—Te may be a material such as $Ge_2Sb_2Te_5$, $Ge_2Sb_2Te_7$, $Ge_1Sb_2Te_4$, $Ge_1Sb_4Te_7$, or the like.

The first variable resistance layer 154-1 may include various phase change materials in addition to Ge—Sb—Te. For example, the first variable resistance layer 154-1 may include at least one of Ge—Te, Sb—Te, In—Se, Ga—Sb, In—Sb, As—Te, Al—Te, Bi—Sb—Te (BST), In—Sb—Te (IST), Ge—Sb—Te, Te—Ge—As, Te—Sn—Se, Ge—Se—Ga, Bi—Se—Sb, Ga—Se—Te, Sn—Sb—Te, In—Sb—Ge, In—Ge—Te, Ge—Sn—Te, Ge—Bi—Te, Ge—Te—Se, As—Sb—Te, Sn—Sb—Bi, Ge—Te—O, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, In—Sn—Sb—Te, and As—Ge—Sb—Te or a combination thereof.

Each of elements included in the first variable resistance layer 154-1 may have various stoichiometry ratios. A crystallization temperature, a melting temperature, a phase change speed based on crystallization energy, and data retention characteristic of the first variable resistance layer 154-1 may be adjusted based on the stoichiometry ratio of each element.

The first variable resistance layer 154-1 may further include at least one impurity of carbon (C), nitrogen (N), silicon (Si), oxygen (O), bismuth (Bi), and tin (Sn). A driving current of the memory device 100 may be changed by the at least one impurity. Also, the first variable resistance layer 154-1 may further include metal. For example, the first variable resistance layer 154-1 may include at least one of aluminium (Al), gallium (Ga), tin (Sn), titanium (Ti), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), lead (Pb), and polonium (Po). Such metal materials increase the electrical conductivity and thermal conductivity of the first variable resistance layer 154-1 to increase a crystallization speed, thereby increasing a set speed. Also, the metal materials enhance the data retention characteristic of the first variable resistance layer 154-1.

The first variable resistance layer 154-1 may have a multilayer structure where two or more layers having different physical properties are stacked. The number or thickness of layers may be freely selected. A barrier layer for preventing materials from being diffused may be further provided between the layers. Also, the first variable resistance layer 154-1 may have a super-lattice structure where a plurality of layers including different materials are alternately stacked. For example, the first variable resistance layer 154-1 may include a structure where a first layer including Ge—Te and a second layer including Sb—Te are alternately stacked. However, a material of the first layer is not limited to Ge—Te, and a material of the second layer is not limited to Sb—Te. The first and second layers may each include the above-described various materials.

Hereinabove, the first variable resistance layer 154-1 has been described above as including a phase change material, but the technical spirit of the inventive concept is not limited thereto. In other embodiments, the first variable resistance layer 154-1 of the memory device 100 may include various materials having a resistance-changing characteristic.

In some embodiments, when the first variable resistance layer 154-1 includes transition metal oxide, the memory device 100 may be resistive random access memory (ReRAM). In the first variable resistance layer 154-1 including transition metal oxide, at least one electrical path may be formed or depleted in the first variable resistance layer 154-1 through a program operation. When the electrical path is formed, the first variable resistance layer 154-1 may have a low resistance value, and when the electrical path is depleted, the first variable resistance layer 154-1 may have a high resistance value. The memory device 100 may store data by using a resistance value difference of the first variable resistance layer 154-1.

When the first variable resistance layer 154-1 includes transition metal oxide, the transition metal oxide may include at least one metal selected from among Ta, Zr, Ti, Hf, Mn, Y, Ni, Co, Zn, Nb, Cu, Fe, and Cr. For example, the transition metal oxide may be formed as a single layer or a multilayer including at least one material selected from among $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and $Fe_2O_{3-x}$. In the above-described materials, x may be selected within a range of $0 \leq x \leq 1.5$, and y may be selected within a range of $0 \leq y \leq 0.5$. However, the present embodiment is not limited thereto.

In other embodiments, when the first variable resistance layer 154-1 has a magnetic tunnel junction (MJT) structure which includes two electrodes including a magnetic material and a dielectric disposed between the two magnetic electrodes, the memory device 100 may be magnetic random access memory (MRAM).

The two electrodes may respectively be a magnetization fixed layer (e.g., magnetization pinning layer) and a magnetization free layer, and the dielectric disposed therebetween may be a tunnel barrier layer. The magnetization fixed layer may have a magnetization direction which is fixed in one direction, and the magnetization free layer may have a magnetization direction which is changeable to be parallel or antiparallel to the magnetization direction of the magnetization fixed layer. The magnetization directions of the magnetization fixed layer and the magnetization free layer may be parallel to one surface of the tunnel barrier layer, but are not limited thereto. In other embodiments, the magnetization directions of the magnetization fixed layer and the magnetization free layer may be perpendicular to the one surface of the tunnel barrier layer.

When the magnetization direction of the magnetization free layer is parallel to the magnetization direction of the magnetization fixed layer, the first variable resistance layer 154-1 may have a first resistance value. When the magnetization direction of the magnetization free layer is antiparallel to the magnetization direction of the magnetization fixed layer, the first variable resistance layer 154-1 may have a second resistance value. By using such a resistance value difference, the memory device 100 may store data. The magnetization direction of the magnetization free layer may be changed by a spin torque of electrons included in a program current.

The magnetization fixed layer and the magnetization free layer may each include a magnetic material. In this case, the magnetization fixed layer may further include an antiferromagnetic material that fixes a magnetization direction of a ferromagnetic material included in the magnetization fixed layer. The tunnel barrier layer may be formed of oxide of at least one material selected from among Mg, Ti, Al, MgZn, and MgB, but is not limited to the above-described example.

The third electrode layer 152-1 and the fourth electrode layer 156-1 may each be a layer that functions as a current path, and may each include a conductive material. For example, each of the third electrode layer 152-1 and the fourth electrode layer 156-1 may include metal, conductive metal nitride, conductive metal oxide, or a combination thereof. In exemplary embodiments, at least one of the third electrode layer 152-1 and the fourth electrode layer 156-1 may include a conductive material that sufficiently generates heat to phase-change the first variable resistance layer 154-1. For example, each of the third electrode layer 152-1 and the fourth electrode layer 156-1 may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, carbon (C), silicon carbide (SiC), silicon carbon nitride (SiCN), carbon nitride (CN), titanium carbon nitride (TiCN), tantalum carbon nitride (TaCN), or high melting-point metals containing combinations thereof, or nitrides thereof, or a carbon-based conductive material. However, a material of each of the third electrode layer 152-1 and the fourth electrode layer 156-1 is not limited to the materials. In other embodiments, each of the third electrode layer 152-1 and the fourth electrode layer 156-1 may include a conductive layer, including metal or conductive metal nitride, and at least one conductive barrier layer covering at least a portion of the conductive layer. The conductive barrier layer may include metal oxide, metal nitride, or a combination thereof, but is not limited thereto.

Unlike the exemplary illustration of FIG. 3, at least one of the first to fourth electrode layers 142-1, 146-1, 152-1, and 156-1 may be omitted. At least one of the second and third electrode layers 146-1 and 152-1 may not be omitted for preventing contamination or a defective contact caused by a direct contact between the first switching material layer 144-1 and the first variable resistance layer 154-1. Also, unlike the exemplary illustration of FIG. 3, one of the second and third electrode layers 146-1 and 152-1 may be formed to have a larger thickness. Therefore, even when the third electrode layer 152-1 or the fourth electrode layer 156-1 generates heat to phase-change the first variable resistance layer 154-1, the first switching material layer 144-1 is prevented from being affected by the generated heat (for example, the first switching material layer 144-1 is prevented from being deteriorated or damaged, such as the first switching material layer 144-1 being partially crystallized due to the heat from the third electrode layer 152-1 or the fourth electrode layer 156-1).

The second switching unit 140-2 may include a fifth electrode layer 142-2, a second switching material layer 144-2, and a sixth electrode layer 146-2 which are sequentially stacked on each of the plurality of second word lines 130-2. The second memory unit 150-2 may include a seventh electrode layer 152-2, a second variable resistance layer 154-2, and an eighth electrode layer 156-2 which are sequentially stacked on the second switching unit 140-2. Here, detailed descriptions of the second switching material layer 144-2, the second variable resistance layer 154-2, and the fifth to eighth electrode layers 142-2, 146-2, 152-2, and 156-2 may refer to the above descriptions of the first switching material layer 144-1, the first variable resistance layer 154-1, and the first to fourth electrode layers 142-1, 146-1, 152-1, and 156-1.

A first insulation layer 132-1 may be disposed between the plurality of first word lines 130-1. A second insulation layer 148-1 may be disposed between the plurality of first memory cells MC1. For example, the second insulation layer 148-1 may surround a sidewall of the first switching unit 140-1 and a sidewall of the first memory unit 150-1. A third insulation layer 162-1 may be disposed between the plurality of first bit lines 160-1 and on the second insulation layer 148-1. A second insulating interlayer 164 may be disposed on the plurality of first bit lines 160-1 and the third insulation layer 162-1. A fourth insulation layer 132-2 may be disposed between the plurality of second word lines 130-2 and on the second insulating interlayer 164. A fifth insulation layer 148-2 may be disposed between the plurality of second memory cells MC2. For example, the fifth insulation layer 148-2 may surround a sidewall of the second switching unit 140-2 and a sidewall of the second memory unit 150-2. A sixth insulation layer 162-2 may be disposed between the plurality of second bit lines 160-2 and on the fifth insulation layer 148-2.

The first to sixth insulation layers 132-1, 148-1, 162-1, 132-2, 148-2, and 162-2 may be provided as insulation layers including the same material, or at least one thereof may be provided as insulation layers including a different material. For example, the first to sixth insulation layers 132-1, 148-1, 162-1, 132-2, 148-2, and 162-2 may each include silicon oxide, silicon nitride, silicon oxynitride, and/or the like. A plurality of air spaces (not shown), instead of at least one of the first to sixth insulation layers 132-1, 148-1, 162-1, 132-2, 148-2, and 162-2, may be provided, and in this case, an insulation liner (not shown) having a certain thickness may be provided between the air spaces and the first memory cell MC1 and/or the air spaces and the second memory cell MC2.

As illustrated in FIG. 4, each of the plurality of first word lines 130-1 may be connected to a portion of the lower wiring layer 122 through a corresponding first word line contact of a plurality of first word line contacts 134-1, and the portion of the lower wiring layer 122 may be electrically connected to a first word line driving circuit (not shown). Each of the plurality of second word lines 130-2 may be connected to a portion of the lower wiring layer 122 through a corresponding second word line contact of a plurality of second word line contacts 134-2, and the portion of the lower wiring layer 122 may be electrically connected to a second word line driving circuit (not shown). The first word line contacts 134-1 may be surrounded by the first insulating interlayer 120, and the second word line contacts 134-2 may be surrounded by the first insulating interlayer 120, the first to third insulation layers 132-1, 148-1, and 162-1, and the second insulating interlayer 164.

As illustrated in FIG. 3, the plurality of first bit lines 160-1 and the plurality of second bit lines 160-2 may be connected to a plurality of first bit line connection structures 170-1. Each of the plurality of first bit line connection structures 170-1 may include a first bit line contact 164-1 and a second bit line contact 164-2.

The first bit line contact 164-1 may be disposed under each of the plurality of first bit lines 160-1 and may be connected to a portion of the lower wiring layer 122, and the portion of the lower wiring layer 122 may be electrically connected to a common bit line driving circuit (not shown). The second bit line contact 164-2 may be disposed between a corresponding first bit line of the plurality of first bit lines 160-1 and a corresponding second bit line of the plurality of second bit lines 160-2. The plurality of second bit lines 160-2 may be electrically connected to the common bit line driving circuit through the second bit line contact 164-2.

As exemplarily illustrated in FIG. 3, the second bit line contact 164-2 may be disposed to vertically overlap the first bit line contact 164-1. The first bit line contact 164-1 may be surrounded by the first insulating interlayer 120 and the first and second insulation layers 132-1 and 148-1, and the second bit line contact 164-2 may be surrounded by the second insulating interlayer 164 and the fourth and fifth insulation layers 132-2 and 148-2.

In some embodiments, each of the first and second word line contacts 134-1 and 134-2 and the first and second bit line contacts 164-1 and 164-2 may include a conductive layer, including metal or conductive metal nitride, and at least one conductive barrier layer covering at least a portion of the conductive layer. The conductive barrier layer may include metal oxide, metal nitride, or a combination thereof, but is not limited thereto.

According to exemplary embodiments, the plurality of first memory cells MC1 may be provided to have the same structure and/or shape (for example, the same dimension) as those of the plurality of second memory cells MC2. For example, as exemplarily illustrated in FIG. 3, a first width W11 of an upper surface of the first variable resistance layer 154-1 in the second direction (the Y direction) may be substantially the same as a second width W21 of an upper surface of the second variable resistance layer 154-2 in the second direction. Also, a direction of a current which flows in the plurality of first memory cells MC1 between the plurality of first word lines 130-1 and the plurality of first bit lines 160-1 may be substantially the same as that of a current which flows in the plurality of second memory cells MC2 between the plurality of second word lines 130-2 and the plurality of second bit lines 160-2.

Generally, in a case where a memory device of a crosspoint type is stacked as two or more layers, a common bit line may be disposed between a first word line and a second word line, a first memory cell may be disposed between the first word line and the common bit line, and a second memory cell may be disposed between the second word line and the common bit line. However, a direction of a current which flows in the first memory cell between the first word line and the common bit line may differ from that of a current which flows in the second memory cell between the second word line and the common bit line. In this case, a threshold voltage of a selection device may vary based on a direction of an electric field applied to the selection device having the OTS characteristic, and thus, an electrical characteristic of the first memory cell may differ from that of the second memory cell.

On the contrary, in order to make the direction of the current flowing in the first memory cell identical to the direction of the current flowing in the second memory cell, the first memory cell and the second memory cell may be symmetrical to each other with respect to the common bit line. However, it is difficult to precisely control a manufacturing process so that a variable resistance of the first memory cell and a variable resistance of the second memory cell have the same dimension and shape. For this reason, an electrical characteristic difference between the first memory cell and the second memory cell occurs, causing a deterioration in reliability of a memory device.

However, according to the above-described embodiments, the plurality of first memory cells MC1 and the plurality of second memory cells MC2 may be provided to have the same structure and/or the same shape (for example, the same dimension), and a direction of a current which flows in the plurality of first memory cells MC1 between the plurality of first word lines 130-1 and the plurality of first bit lines 160-1 may be substantially the same as that of a current which flows in the plurality of second memory cells MC2 between the plurality of second word lines 130-2 and the plurality of second bit lines 160-2. Accordingly, an electrical characteristic difference between the first memory cell and the second memory cell does not occur, thereby enhancing the reliability of the memory device.

Moreover, the plurality of first bit lines 160-1 and the plurality of second bit lines 160-2 may be electrically connected to the common bit line driving circuit through the plurality of first bit line connection structures 170-1, and thus, in comparison with a case where each of the bit lines is connected to an individual driving circuit, an area of the wiring connection area PA and an area of the driving circuit are reduced, thereby obtaining a compact memory device 100.

Figure 5:
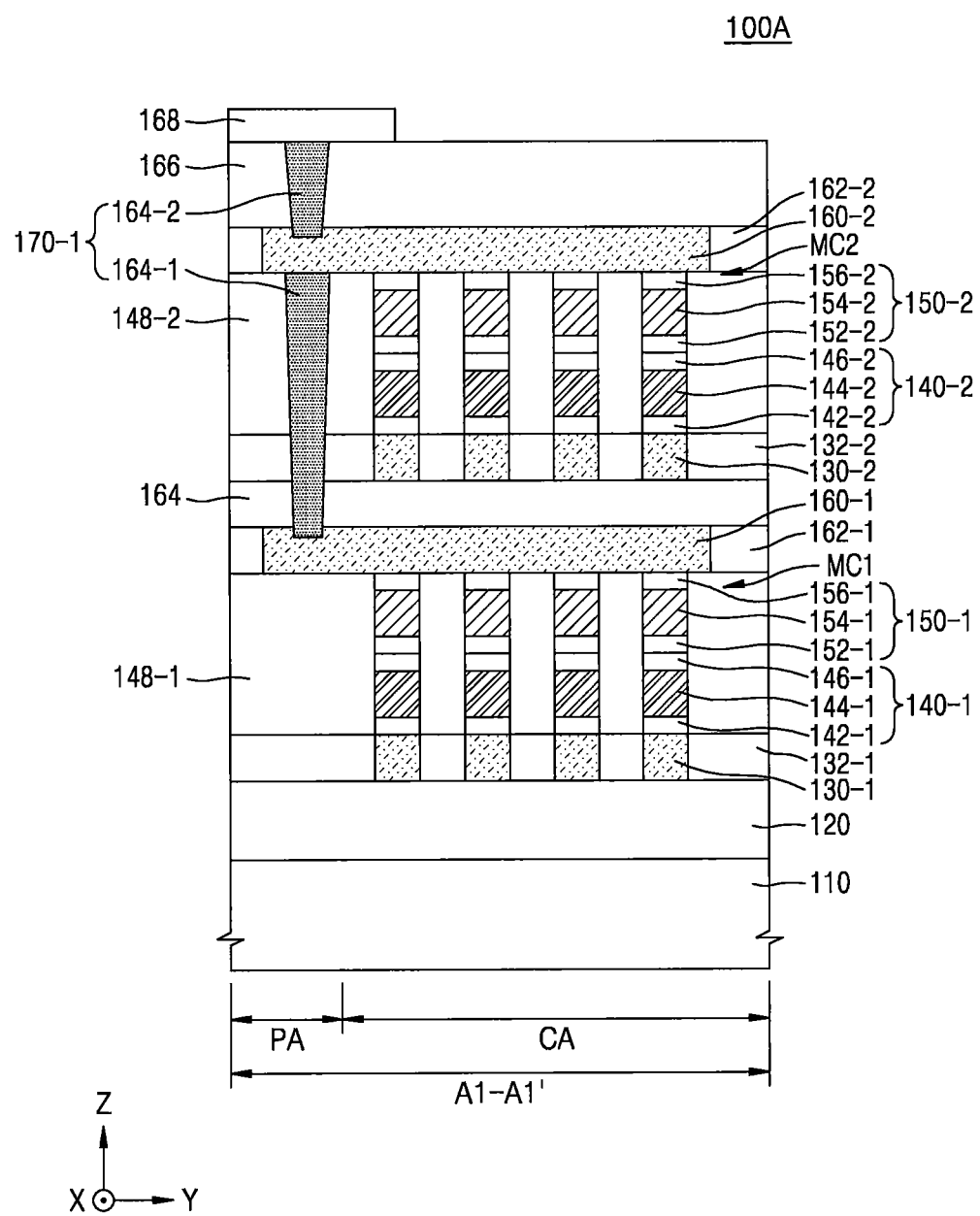
FIG. 5 is a cross-sectional view illustrating a memory device according to exemplary embodiments.

FIG. 5 is a cross-sectional view illustrating a memory device 100A according to exemplary embodiments. FIG. 5 illustrates a cross-sectional surface corresponding to a cross-sectional surface taken along line A1-A1' of FIG. 2. In FIG. 5, like reference numerals in FIGS. 1 to 4 refer to like elements.

Referring to FIG. 5, a plurality of first bit line connection structures 170-1 may each include a first bit line contact 164-1 and a second bit line contact 164-2 which is disposed to vertically overlap the first bit line contact 164-1.

The first bit line contact 164-1 may be disposed between a corresponding first bit line of a plurality of first bit lines 160-1 and a corresponding second bit line of a plurality of second bit lines 160-2, and the second bit line contact 164-2 may be disposed on each of the plurality of second bit lines 160-2. A third insulating interlayer 166 may be disposed on the plurality of second bit lines 160-2 and a sixth insulation layer 162-2 and may surround a sidewall of the second bit line contact 164-2. An upper wiring layer 168 may be disposed on the third insulating interlayer 166, and the second bit line contact 164-2 may be connected to the upper wiring layer 168. The upper wiring layer 168 may be electrically connected to a common bit line driving circuit (not shown).

Figure 6:
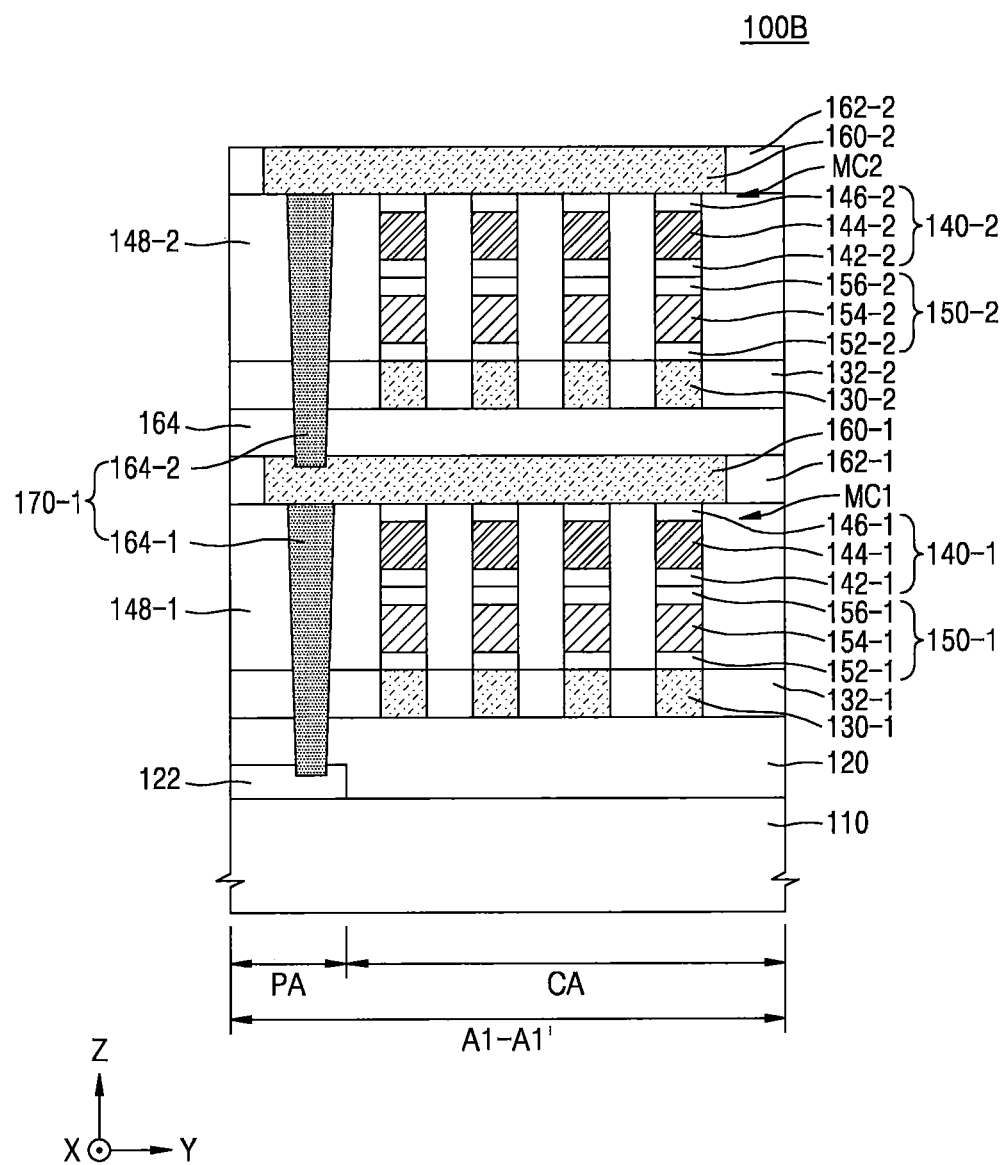
FIG. 6 is a cross-sectional view illustrating a memory device according to exemplary embodiments.

FIG. 6 is a cross-sectional view illustrating a memory device 100B according to exemplary embodiments. FIG. 6 illustrates a cross-sectional surface corresponding to a cross-sectional surface taken along line A1-A1' of FIG. 2. In FIG. 6, like reference numerals in FIGS. 1 to 5 refer to like elements.

Referring to FIG. 6, a plurality of first memory cells MC1 may each include a first switching unit 140-1 and a first memory unit 150-1. The first memory unit 150-1 may be disposed on each of a plurality of first word lines 130-1, and the first switching unit 140-1 may be disposed on the first memory unit 150-1. A plurality of second memory cells MC2 may each include a second switching unit 140-2 and a second memory unit 150-2. The second memory unit 150-2 may be disposed on each of a plurality of second word lines 130-2, and the second switching unit 140-2 may be disposed on the second memory unit 150-2.

According to the above-described embodiments, the plurality of first memory cells MC1 may be provided to have the same structure and/or shape (for example, the same dimension) as those of the plurality of second memory cells MC2, and a direction of a current which flows in the plurality of first memory cells MC1 between the plurality of first word lines 130-1 and a plurality of first bit lines 160-1 may be substantially the same as that of a current which flows in the plurality of second memory cells MC2 between the plurality of second word lines 130-2 and a plurality of second bit lines 160-2. Accordingly, the occurrence of an electrical characteristic difference between the plurality of first memory cells MC1 and the plurality of second memory cells MC2 is prevented.

Figure 7:
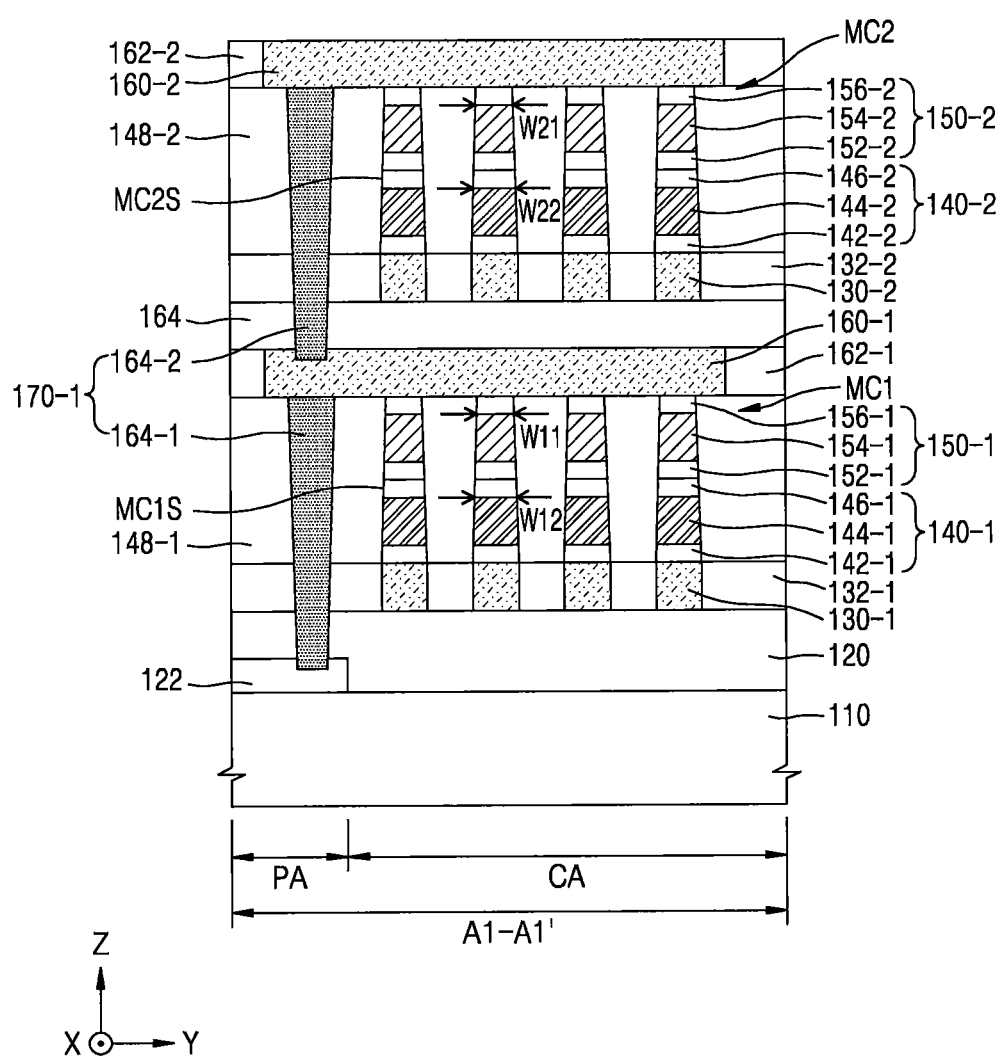
FIG. 7 is a cross-sectional view illustrating a memory device according to exemplary embodiments.

FIG. 7 is a cross-sectional view illustrating a memory device 100C according to exemplary embodiments. FIG. 7 illustrates a cross-sectional surface corresponding to a cross-sectional surface taken along line A1-A1' of FIG. 2. In FIG. 7, like reference numerals in FIGS. 1 to 6 refer to like elements.

Referring to FIG. 7, a plurality of first memory cells MC1 may each include an inclined sidewall MC1S, and a first width W11 of an upper surface of a first variable resistance layer 154-1 in a second direction (a Y direction) may be less than a third width W12 of an upper surface of a first switching material layer 144-1 in the second direction. A plurality of second memory cells MC2 may each include an inclined sidewall MC2S, and a second width W21 of an upper surface of a second variable resistance layer 154-2 in the second direction may be less than a fourth width W22 of an upper surface of a second switching material layer 144-2 in the second direction. Also, the first width W11 of the upper surface of the first variable resistance layer 154-1 in the second direction may be substantially the same as the second width W21 of the upper surface of the second variable resistance layer 154-2 in the second direction, and the third width W12 of the upper surface of the first switching material layer 144-1 in the second direction may be substantially the same as the fourth width W22 of the upper surface of the second switching material layer 144-2 in the second direction.

In exemplary embodiments, a first memory stack M1 (see FIG. 23) may be provided on a plurality of first word lines 130-1 and a first insulation layer 132-1, and a mask pattern (not shown) may be provided on the first memory stack M1. Subsequently, an anisotropic etching process may be performed on the first memory stack M1 by using the mask pattern as an etch mask, thereby forming the plurality of first memory cells MC1. An upper width of each of the plurality of first memory cells MC1 may be exposed to an etch atmosphere longer during the anisotropic etching process, and thus, the plurality of first memory cells MC1 may each include the inclined sidewall MC1S.

According to exemplary embodiments, although the plurality of first memory cells MC1 each include the inclined sidewall MC1S and the plurality of second memory cells MC2 each include the inclined sidewall MC2S, the plurality of first memory cells MC1 may have the same shape and dimension as those of the plurality of second memory cells MC2. Also, a direction of a current which flows in the plurality of first memory cells MC1 between the plurality of first word lines 130-1 and a plurality of first bit lines 160-1 may be substantially the same as that of a current which flows in the plurality of second memory cells MC2 between a plurality of second word lines 130-2 and a plurality of second bit lines 160-2. Accordingly, the occurrence of an electrical characteristic difference between the plurality of first memory cells MC1 and the plurality of second memory cells MC2 is prevented.

Figure 8:
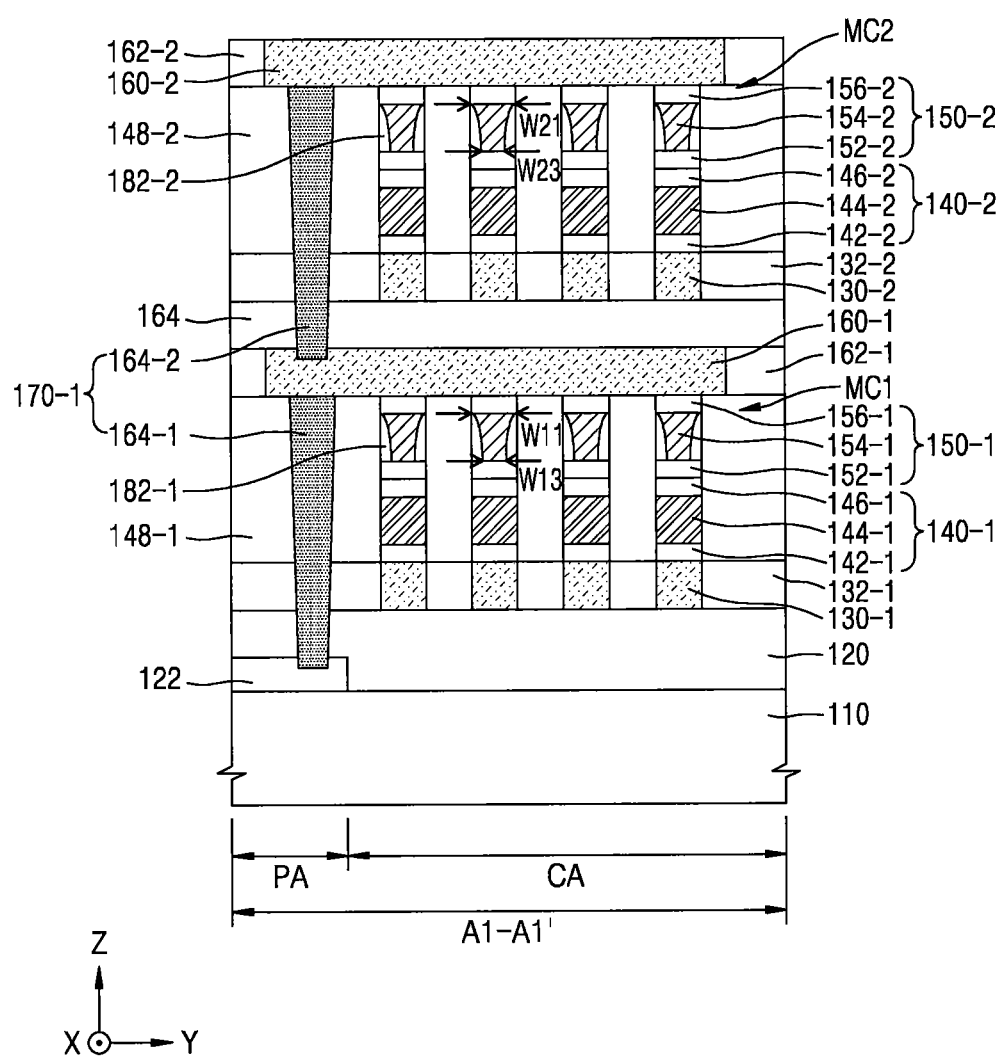
FIG. 8 is a cross-sectional view illustrating a memory device according to exemplary embodiments.

FIG. 8 is a cross-sectional view illustrating a memory device 100D according to exemplary embodiments. FIG. 8 illustrates a cross-sectional surface corresponding to a cross-sectional surface taken along line A1-A1' of FIG. 2. In FIG. 8, like reference numerals in FIGS. 1 to 7 refer to like elements.

Referring to FIG. 8, a first spacer 182-1 may be provided on both sidewalls of a first variable resistance layer 154-1, and a second spacer 182-2 may be provided on both sidewalls of a second variable resistance layer 154-2.

In exemplary embodiments, an insulation layer (not shown) may be formed on a third electrode layer 152-1, a trench may be formed on the insulation layer, and the first spacer 182-1 may be formed on a sidewall of the trench. Subsequently, the first variable resistance layer 154-1 filling the trench may be formed on the first spacer 182-1. The first spacer 182-1 may be formed in a shape where a lower width of the first spacer 182-1 is greater than an upper width. The above-described manufacturing process may be referred to as a damascene process.

As exemplarily illustrated in FIG. 8, a first width W11 of an upper surface of the first variable resistance layer 154-1 in a second direction (a Y direction) may be greater than a width W13 of a bottom surface of the first variable resistance layer 154-1 in the second direction. A second width W21 of an upper surface of the second variable resistance layer 154-2 in the second direction may be greater than a width W23 of a bottom surface of the second variable resistance layer 154-2 in the second direction.

According to exemplary embodiments, the first width W11 of the upper surface of the first variable resistance layer 154-1 in the second direction (the Y direction) may be substantially the same as the second width W21 of the upper surface of the second variable resistance layer 154-2 in the second direction, and the width W13 of the bottom surface of the first variable resistance layer 154-1 in the second direction may be substantially the same as the width W23 of the bottom surface of the second variable resistance layer 154-2 in the second direction.

In a memory device of a crosspoint type according to a comparative example, in order to make a direction of a current flowing in a first memory cell identical to a direction of a current flowing in a second memory cell, the first memory cell and the second memory cell may be symmetrical to each other with respect to a common bit line. However, since a variable resistance layer formed through the damascene process has an upper width and a lower width which is different from each other, a volume of a phase change occurrence area in a variable resistance layer of the first memory cell may differ from a volume of a phase change occurrence area in a variable resistance layer of the second memory cell. For this reason, an electrical characteristic difference between the first memory cell and the second memory cell occurs.

However, according to the above-described embodiments, the first variable resistance layer 154-1 and the second variable resistance layer 154-2 may have the same shape and dimension, and a direction of a current which flows in a plurality of first memory cells MC1 between a plurality of first word lines 130-1 and a plurality of first bit lines 160-1 may be substantially the same as that of a current which flows in a plurality of second memory cells MC2 between a plurality of second word lines 130-2 and a plurality of second bit lines 160-2. Accordingly, the occurrence of an electrical characteristic difference between the plurality of first memory cells MC1 and the plurality of second memory cells MC2 is prevented.

Figure 9:
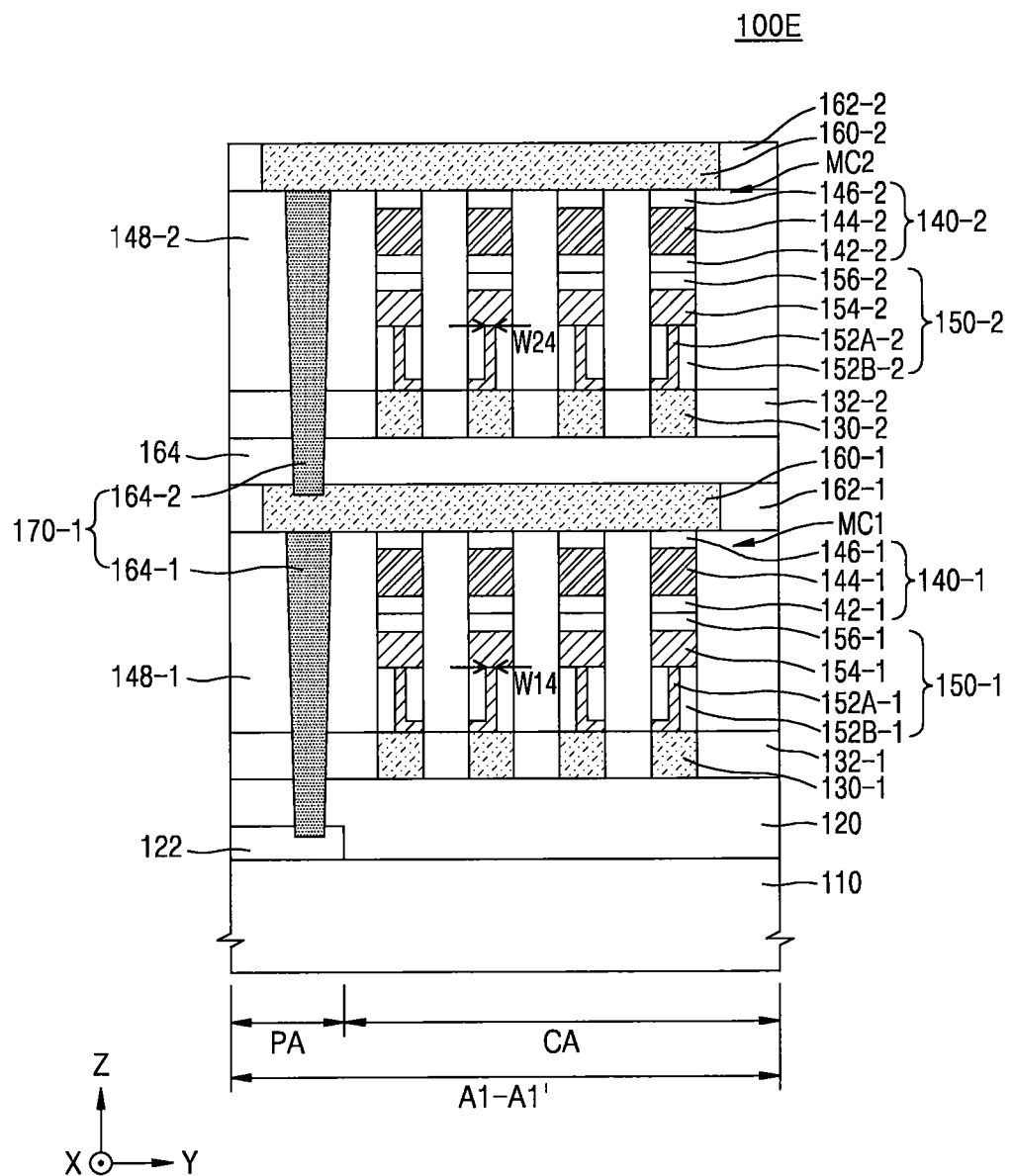
FIG. 9 is a cross-sectional view illustrating a memory device according to exemplary embodiments.

FIG. 9 is a cross-sectional view illustrating a memory device 100E according to exemplary embodiments. FIG. 9 illustrates a cross-sectional surface corresponding to a cross-sectional surface taken along line A1-A1' of FIG. 2. In FIG. 9, like reference numerals in FIGS. 1 to 8 refer to like elements.

Referring to FIG. 9, a third electrode layer 152A-1 and a seventh electrode layer 152A-2 may each have an L-shape. A first spacer 152B-1 may be provided on both sidewalls of the third electrode layer 152A-1, and a second spacer 152B-2 may be provided on both sidewalls of the seventh electrode layer 152A-2. A with W14 of an upper surface of the third electrode layer 152A-1 in a second direction (a Y direction) may be substantially the same as a width W24 of an upper surface of the seventh electrode layer 152A-2 in the second direction.

The third electrode layer 152A-1 and the seventh electrode layer 152A-2 may each include a conductive material that sufficiently generates heat to phase-change a first variable resistance layer 154-1 and a second variable resistance layer 154-2. Here, the third electrode layer 152A-1 may be referred to as a first heating electrode, and the seventh electrode layer 152A-2 may be referred to as a second heating electrode. The reliability of the first and second memory units 150-1 and 150-2 is enhanced due to a relative small contact area between the third electrode layer 152A-1 and the first variable resistance layer 154-1 and a relative small contact area between the seventh electrode layer 152A-2 and the second variable resistance layer 154-2.

In a memory device of a crosspoint type according to a comparative example, in order to make a direction of a current flowing in a first memory cell identical to a direction of a current flowing in a second memory cell, the first memory cell and the second memory cell may be symmetrical to each other with respect to a common bit line. In order for the first memory cell to be symmetrical to the second memory cell, the third electrode layer 152A-1 and the seventh electrode layer 152A-2 may be respectively formed in an L-shape and an inverted-L-shape, but a process of forming the third electrode layer 152A-1 and the seventh electrode layer 152A-2 respectively having the shapes may be very difficult.

However, according to the above-described embodiments, the third electrode layer 152A-1 and the seventh electrode layer 152A-2 may have the same L-shape and dimension, and a direction of a current which flows in a plurality of first memory cells MC1 between a plurality of first word lines 130-1 and a plurality of first bit lines 160-1 may be substantially the same as that of a current which flows in a plurality of second memory cells MC2 between a plurality of second word lines 130-2 and a plurality of second bit lines 160-2. Accordingly, the occurrence of an electrical characteristic difference between the plurality of first memory cells MC1 and the plurality of second memory cells MC2 is prevented.

Figure 10:
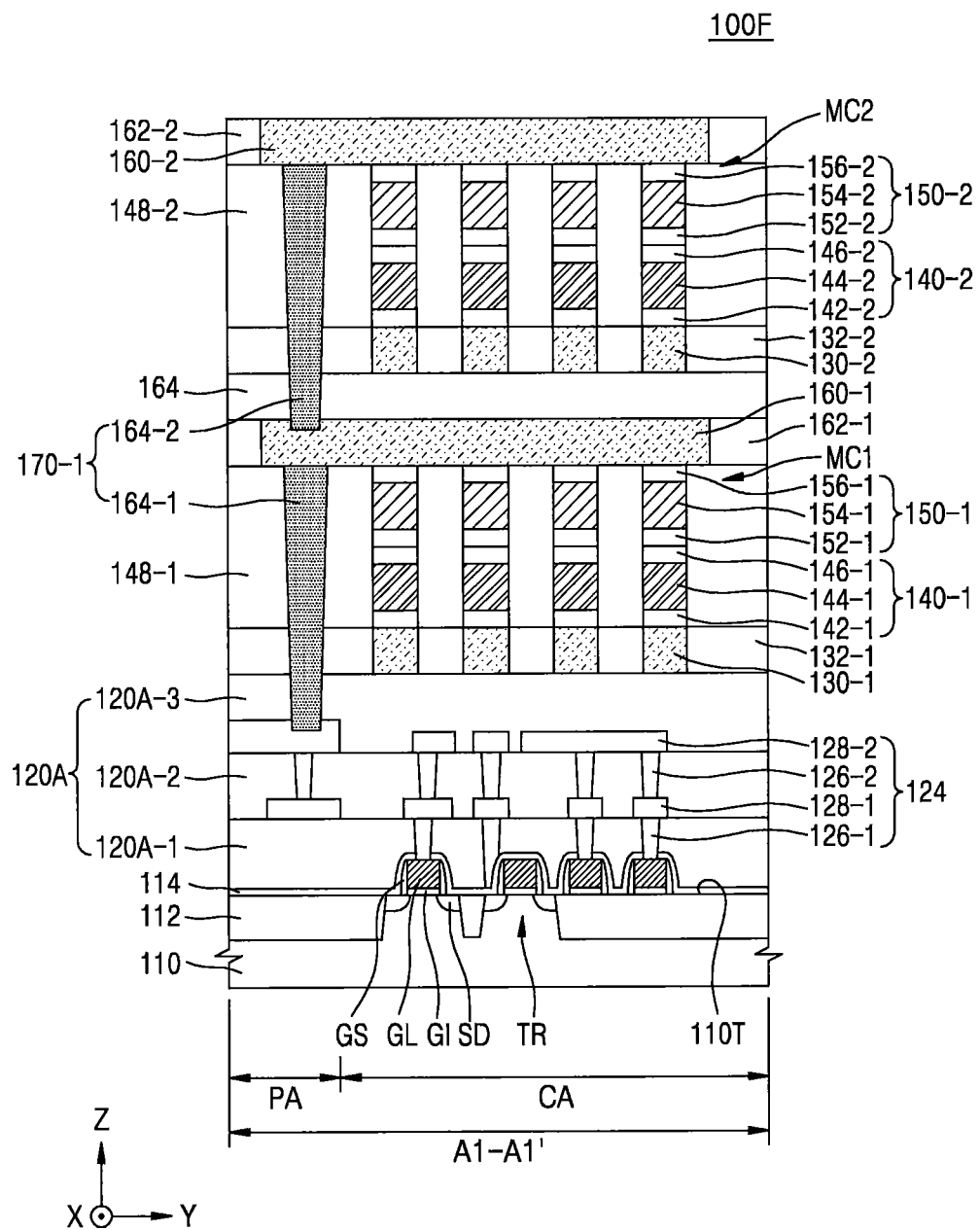
FIG. 10 is a cross-sectional view illustrating a memory device according to exemplary embodiments.

FIG. 10 is a cross-sectional view illustrating a memory device 100F according to exemplary embodiments. FIG. 10 illustrates a cross-sectional surface corresponding to a cross-sectional surface taken along line A1-A1' of FIG. 2. In FIG. 10, like reference numerals in FIGS. 1 to 9 refer to like elements.

Referring to FIG. 10, a plurality of transistors TR configuring a driving circuit may be provided on a substrate 110, and first and second memory cells MC1 and MC2 may be disposed at a level which is higher than the plurality of transistors TR.

For example, the driving circuit may be a peripheral circuit for driving the first and second memory cells MC1 and MC2. For example, the driving circuit may include peripheral circuits for processing data input/output to/from the first and second memory cells MC1 and MC2 at a high speed. For example, the peripheral circuits may be a page buffer, latch circuit, a cache circuit, a column decoder, a sense amplifier, a data in/out circuit, a row decoder, and/or the like.

An active area (not shown) for the driving circuit may be defined by an isolation layer 112 on a substrate 110, and the plurality of transistors TR may be provided in the active area. The plurality of transistors TR may each include a gate GL, a gate insulation layer GI, and a source/drain area SD. Both sidewalls of the gate GL may be covered by a gate spacer GS, and an etch stop layer 114 covering the gate GL and the gate spacer GS may be formed on a top surface 110T of the substrate 110. The etch stop layer 114 may include an insulating material such as silicon nitride, silicon oxynitride, or the like.

A first insulating interlayer 120A including a first lower insulation layer 120A-1, a second lower insulation layer 120A-2, and a third lower insulation layer 120A-3 may be formed on the etch stop layer 114. A multilayer wiring structure 124 may be electrically connected to the plurality of transistors TR. The multilayer wiring structure 124 may include a first via 126-1, a first wiring layer 128-1, a second via 126-2, and a second wiring layer 128-2 which are sequentially stacked on the substrate 110 and are electrically connected to one another, and may be surrounded by the first insulating interlayer 120A. A plurality of first word lines 130-1 and a first insulation layer 132-1 may be disposed on the first insulating interlayer 120A, and a first bit line contact 164-1 may be connected to the multilayer wiring structure 124.

In the memory device 100F according exemplary embodiments, since the first and second memory cells MC1 and MC2 are disposed on the plurality of transistors TR configuring the driving circuit, a degree of integration of the memory device 100F is more enhanced.

Figure 11:
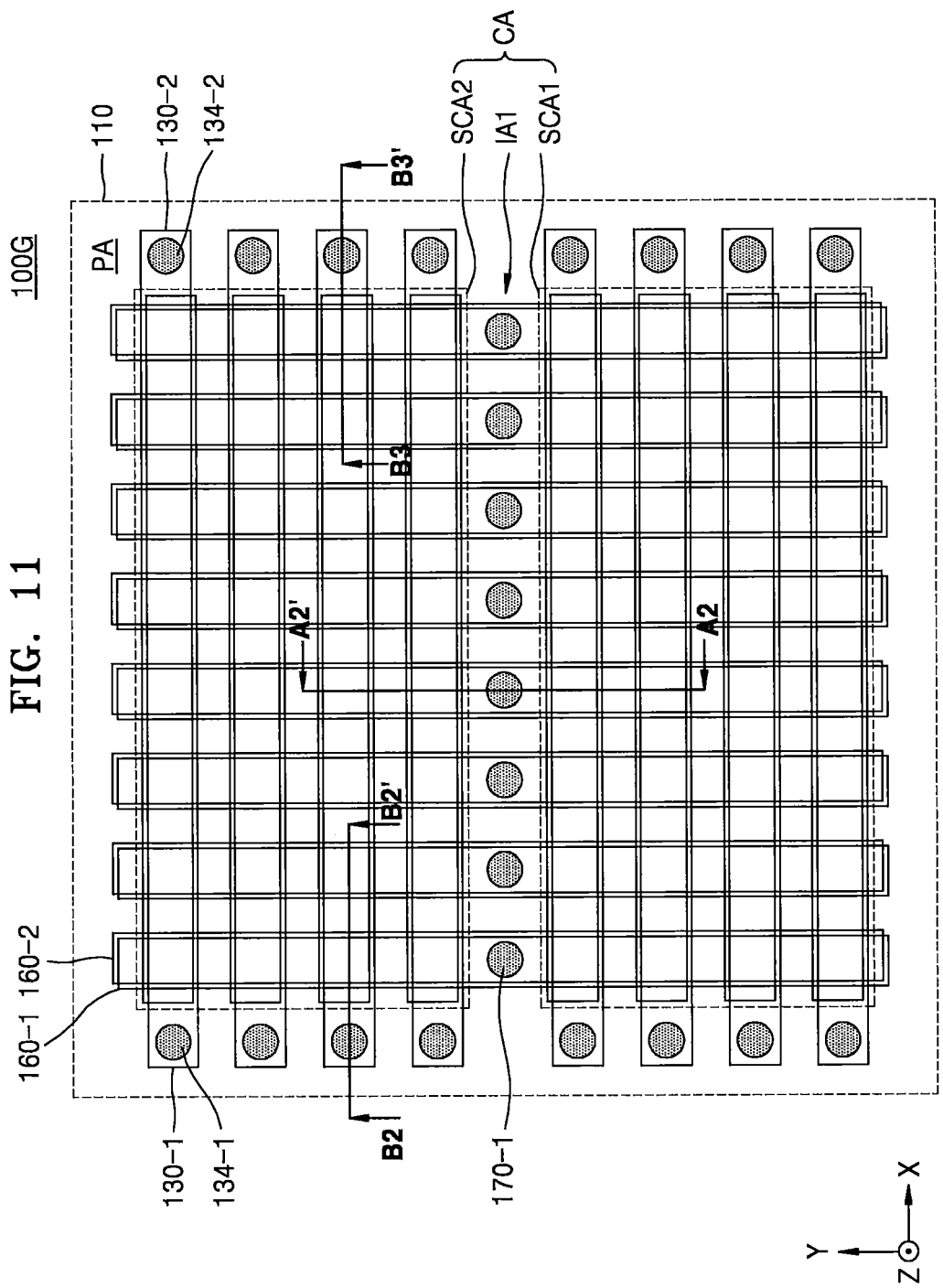
FIG. 11 is a layout diagram illustrating a representative configuration of a memory device according to exemplary embodiments.
Figure 12:
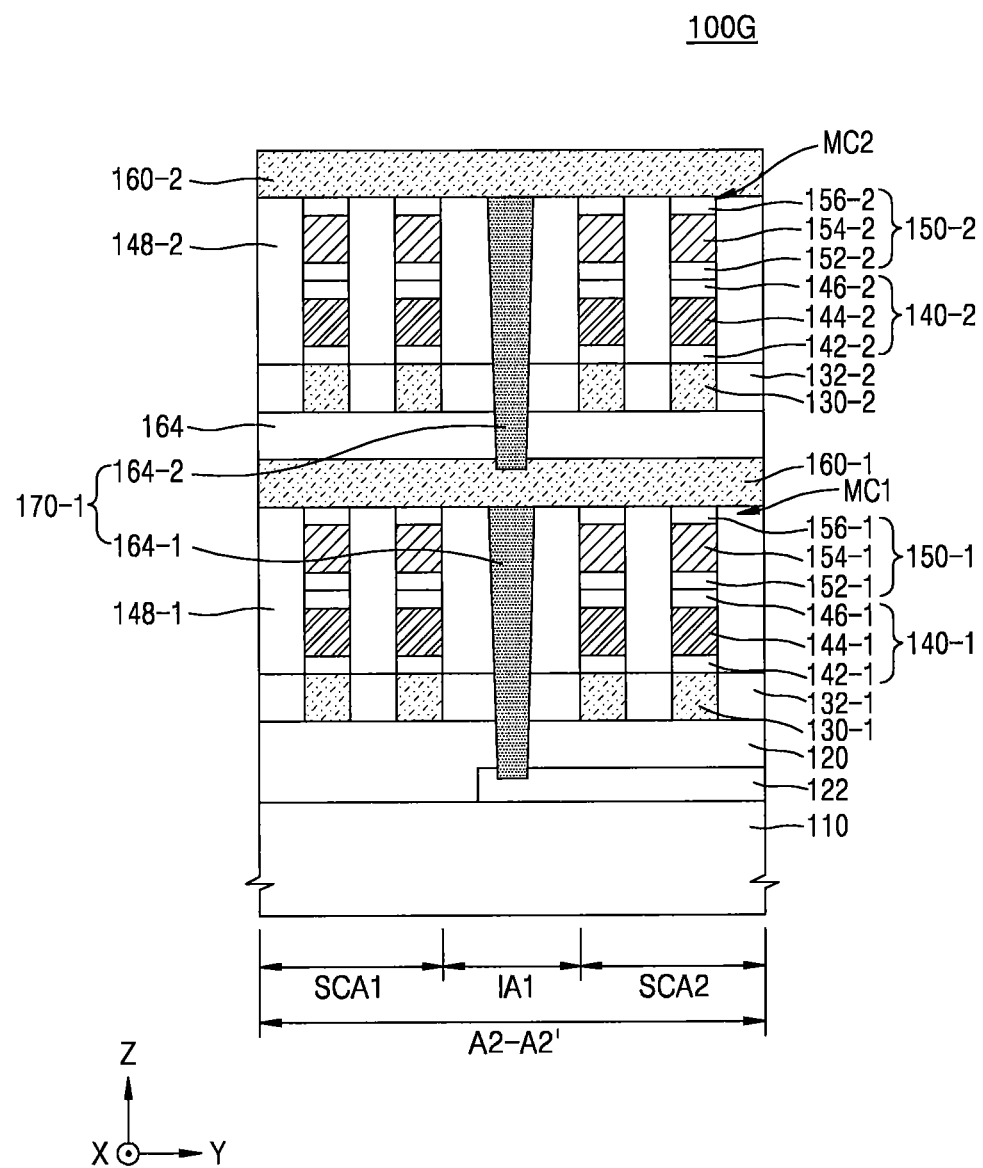
FIG. 12 is a cross-sectional view taken along line A2-A2' of FIG. 11.
Figure 13:
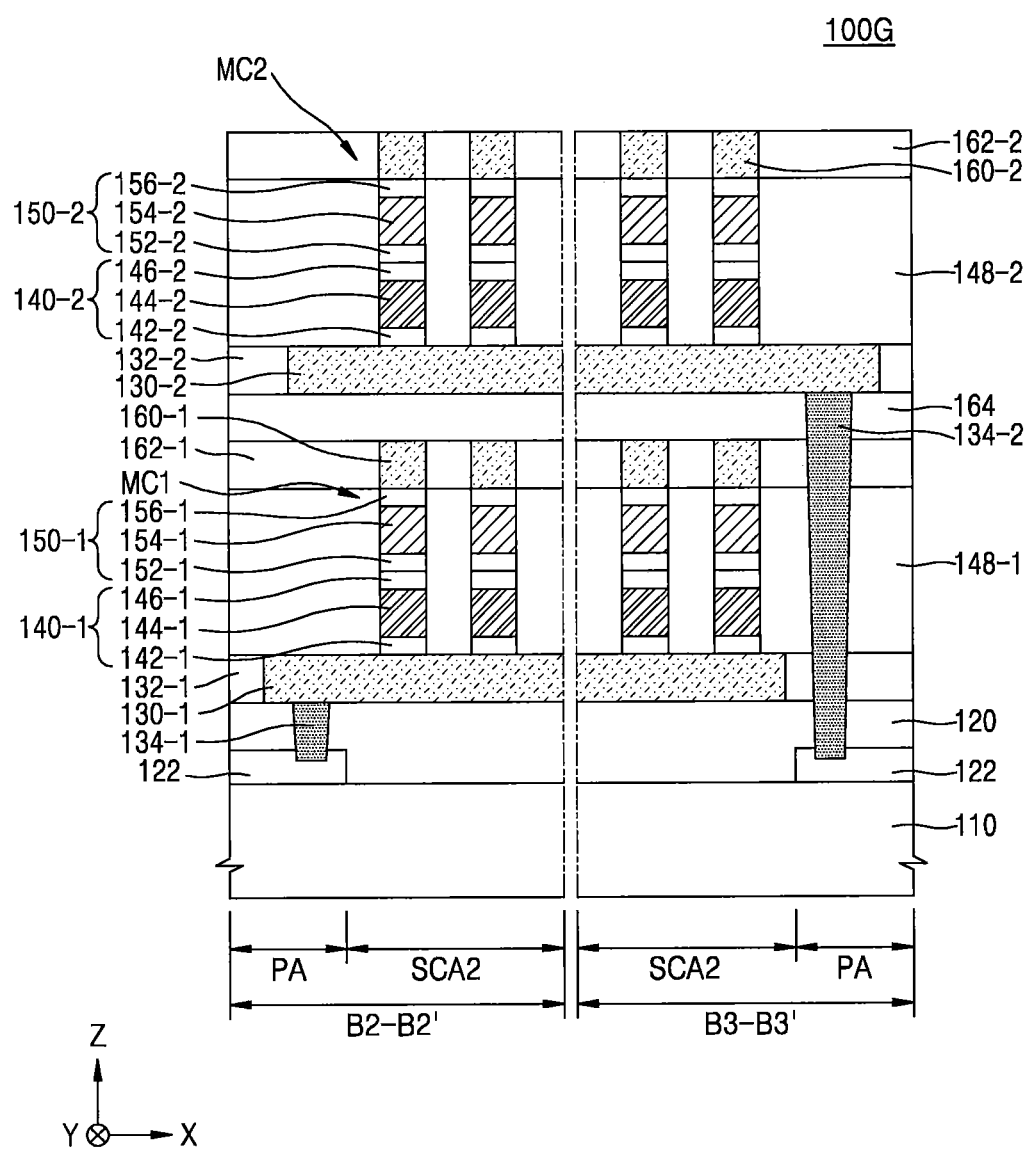
FIG. 13 is cross-sectional views taken along lines B2-B2' and B3-B3' of FIG. 11.

FIG. 11 is a layout diagram illustrating a representative configuration of a memory device 100G according to exemplary embodiments. FIG. 12 is a cross-sectional view taken along line A2-A2' of FIG. 11. FIG. 13 is cross-sectional views taken along lines B2-B2' and B3-B3' of FIG. 11.

Referring to FIGS. 11 to 13, a memory cell array area CA of a substrate 110 may include a first sub-cell array area SCA1, a second sub-cell array area SCA2, and a first isolation area IA1. For example, as seen in a plan view, the first sub-cell array area SCA1 and the second sub-cell array area SCA2 may be disposed in a center of the substrate 110 and may be spaced apart from each other with the first isolation area IA1 therebetween, and a wiring connection area PA may be disposed to surround the first sub-cell array area SCA1, the second sub-cell array area SCA2, and the first isolation area IA1. A plurality of first memory cells MC1 and a plurality of second memory cells MC2 may be disposed in the first sub-cell array area SCA1 and the second sub-cell array area SCA2. First and second word line contacts 134-1 and 134-2 may be disposed in the wiring connection area PA, and a first bit line connection structure 170-1 may be disposed in the first isolation area IA1. For example, the plurality of first memory cells MC1 and the plurality of second memory cells MC2 are disposed opposite the memory cell array area CA and the first bit line connection structure 170-1 may be disposed opposite the memory cell array area CA.

According to exemplary embodiments, in comparison with a case where the first bit line connection structure 170-1 is disposed outside the memory cell array area CA, since the first bit line connection structure 170-1 is disposed between the first sub-cell array area SCA1 and the second sub-cell array area SCA2, a distance between each of the plurality of first memory cells MC1 and the first bit line connection structure 170-1 is reduced, and thus, the drop of an applied voltage (or IR drop) is reduced by the plurality of first memory cells MC1, and an electrical characteristic difference between the plurality of first memory cells MC1 is reduced. Likewise, the drop of an applied voltage (or IR drop) is reduced by the plurality of second memory cells MC2, and electrical characteristic differences between the plurality of second memory cells MC2 is thereby advantageously reduced.

Figure 14:
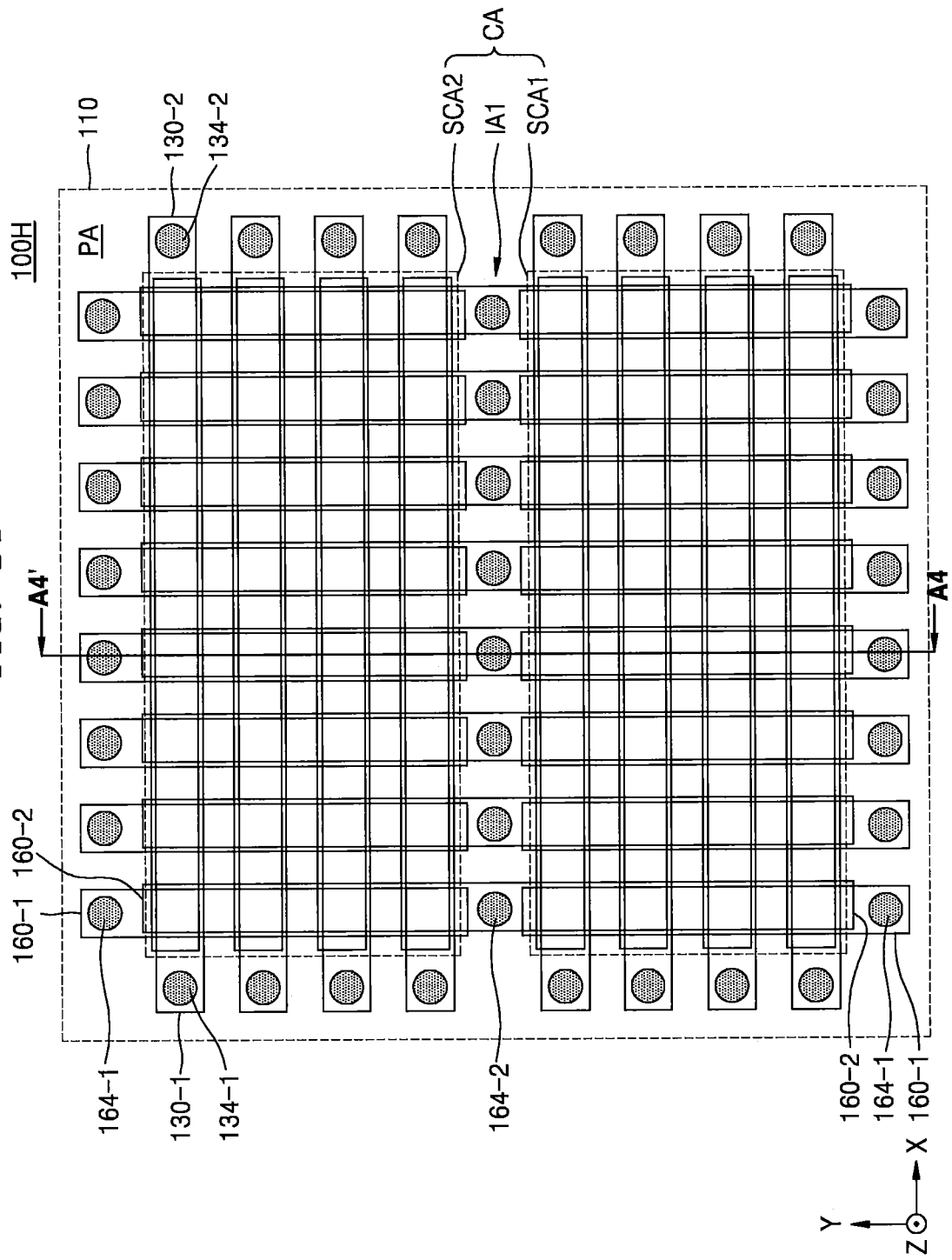
FIG. 14 is a layout diagram illustrating a representative configuration of a memory device according to exemplary embodiments.
Figure 15:
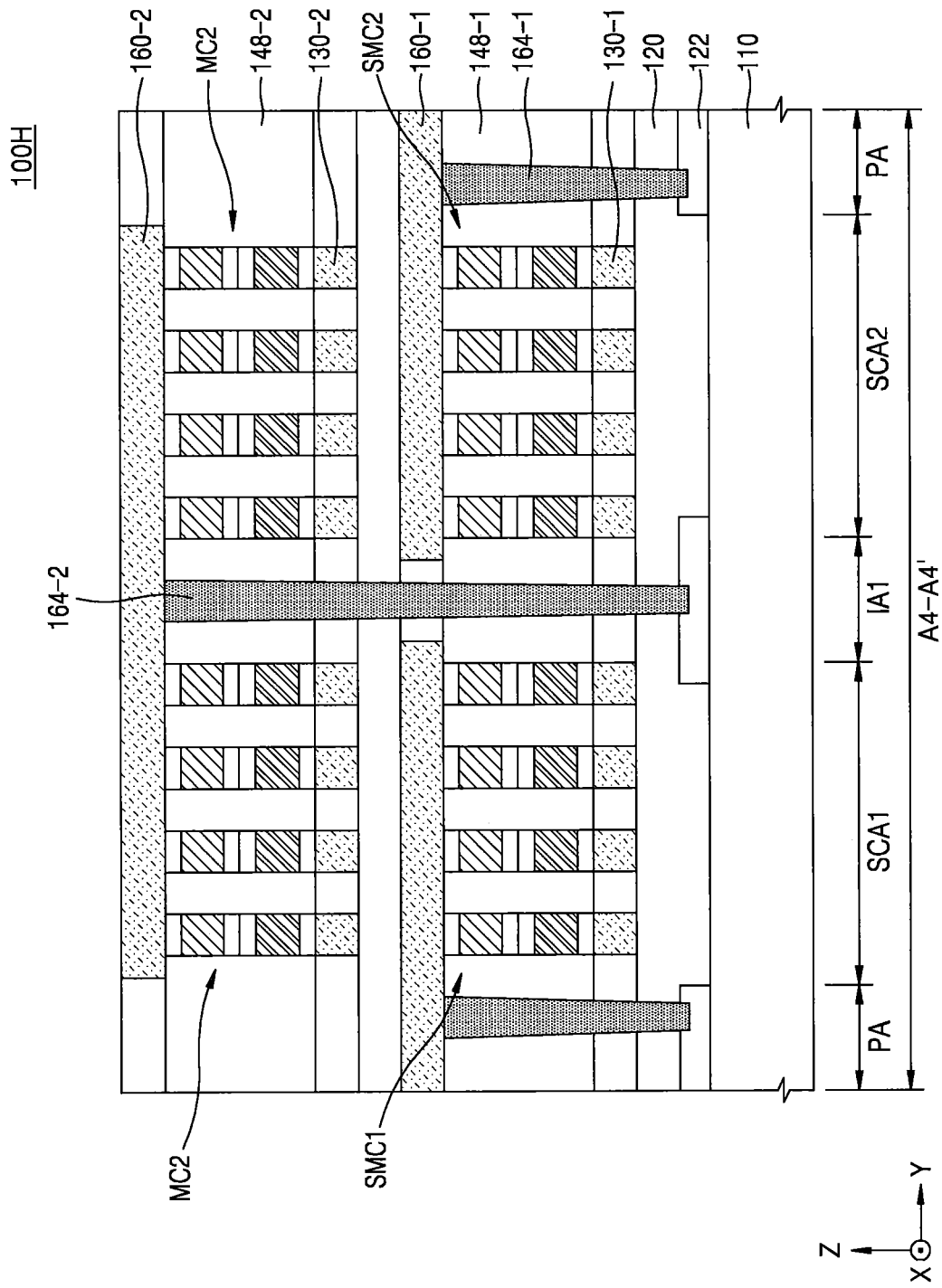
FIG. 15 is a cross-sectional view taken along line A4-A4' of FIG. 14.

FIG. 14 is a layout diagram illustrating a representative configuration of a memory device 100H according to exemplary embodiments. FIG. 15 is a cross-sectional view taken along line A4-A4' of FIG. 14.

Referring to FIGS. 14 and 15, a first sub-memory cell SMC1 may be disposed in a first sub-cell array area SCA1, and a second sub-memory cell SMC2 may be disposed in a second sub-cell array area SCA2. A plurality of first bit lines 160-1 may be disposed on the first sub-memory cell SMC1 and the second sub-memory cell SMC2 and may be connected to a first bit line contact 164-1 disposed in a wiring connection area PA. The first sub-memory cell SMC1 and the second sub-memory cell SMC2 may be electrically connected to a common bit line driving circuit (not shown) and may be electrically connected to different bit line driving circuits (not shown).

A second memory cell MC2 may be disposed in the first sub-cell array area SCA1 and the second sub-cell array area SCA2. A plurality of second bit lines 160-2 may be disposed on the second memory cell MC2 and may be connected to a second bit line contact 164-2 disposed in a first isolation area IA1.

Figure 16:
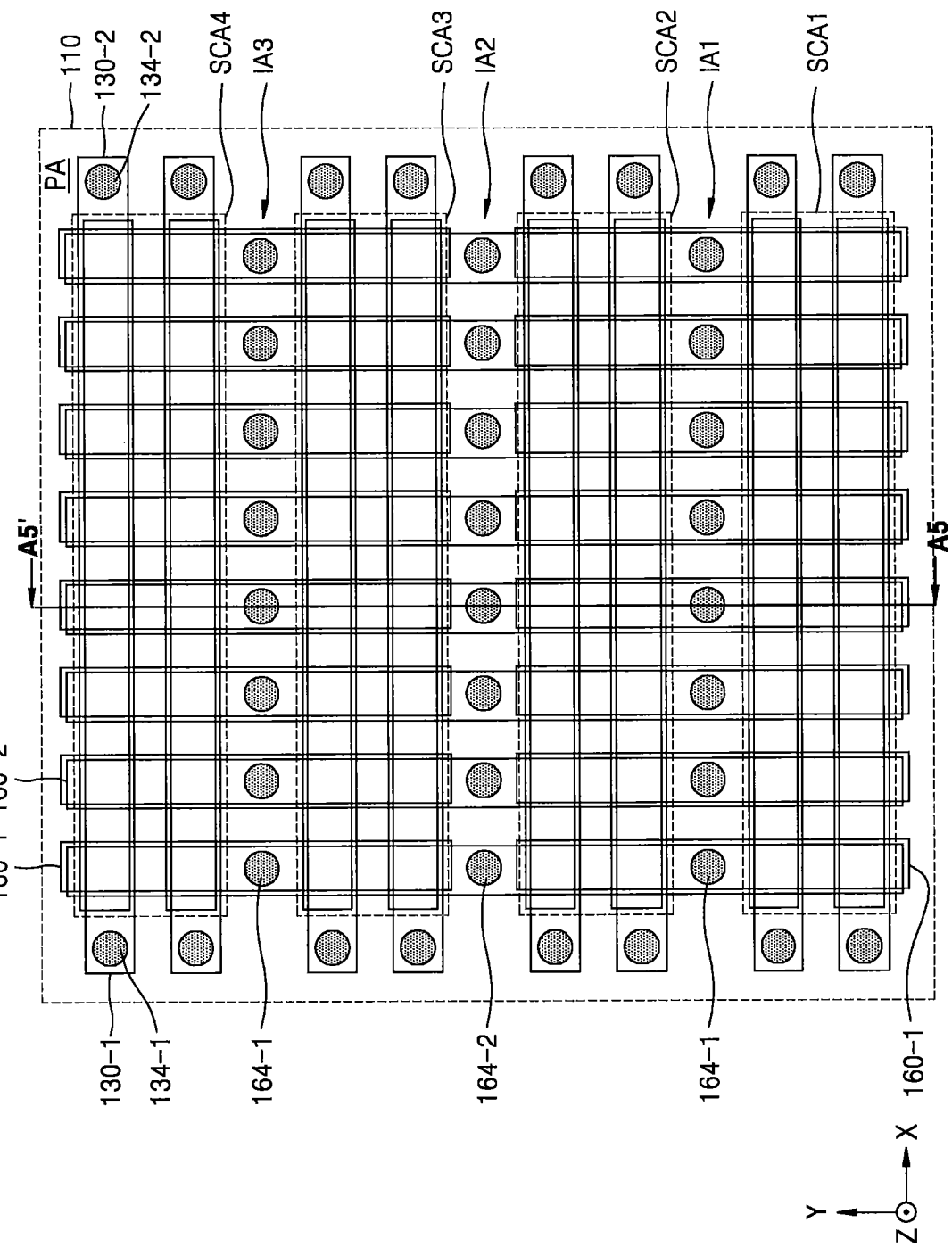
FIG. 16 is a layout diagram illustrating a representative configuration of a memory device according to exemplary embodiments.
Figure 17:
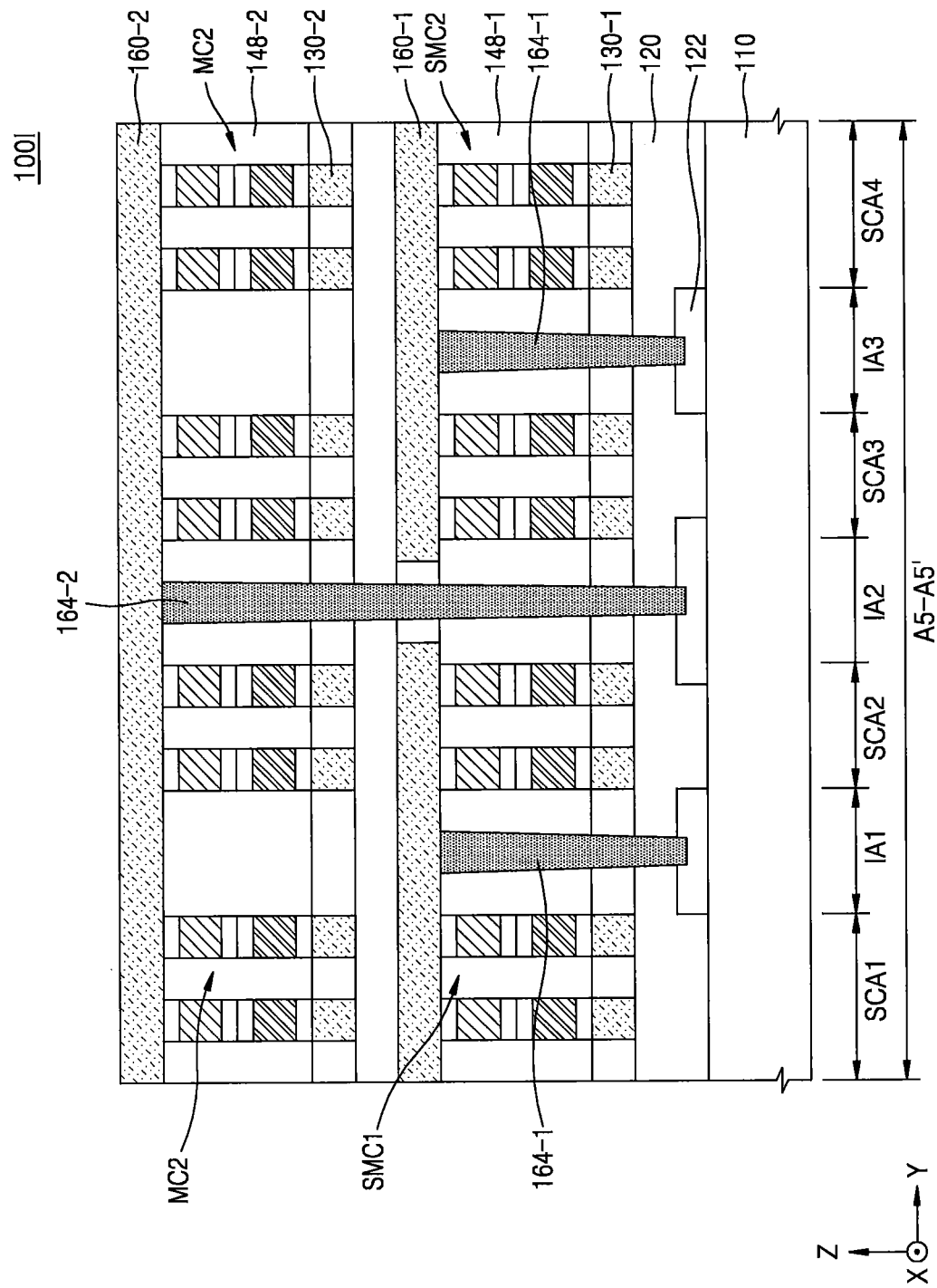
FIG. 17 is a cross-sectional view taken along line A5-A5' of FIG. 16.

FIG. 16 is a layout diagram illustrating a representative configuration of a memory device 100I according to exemplary embodiments. FIG. 17 is a cross-sectional view taken along line A5-A5' of FIG. 16.

Referring to FIGS. 16 and 17, a substrate 110 may include a first sub-cell array area SCA1, a first isolation area IA1, a second sub-cell array area SCA2, a second isolation area IA2, a third sub-cell array area SCA3, a third isolation area IA3, and a fourth sub-cell array area SCA41 which are continuously disposed, and may further include a wiring connection area PA surrounding the areas. A first bit line contact 164-1 electrically connected to the first sub-memory cell SMC1 may be disposed in the first isolation area IA1, and another first bit line contact 164-1 electrically connected to the second sub-memory cell SMC2 may be disposed in the third isolation area IA3.

According to the above-described embodiments, the drop of a voltage (or IR drop) applied to the first sub-memory cell SMC1, the second sub-memory cell SMC2, and a second memory cell MC2 is reduced.

Figure 18:
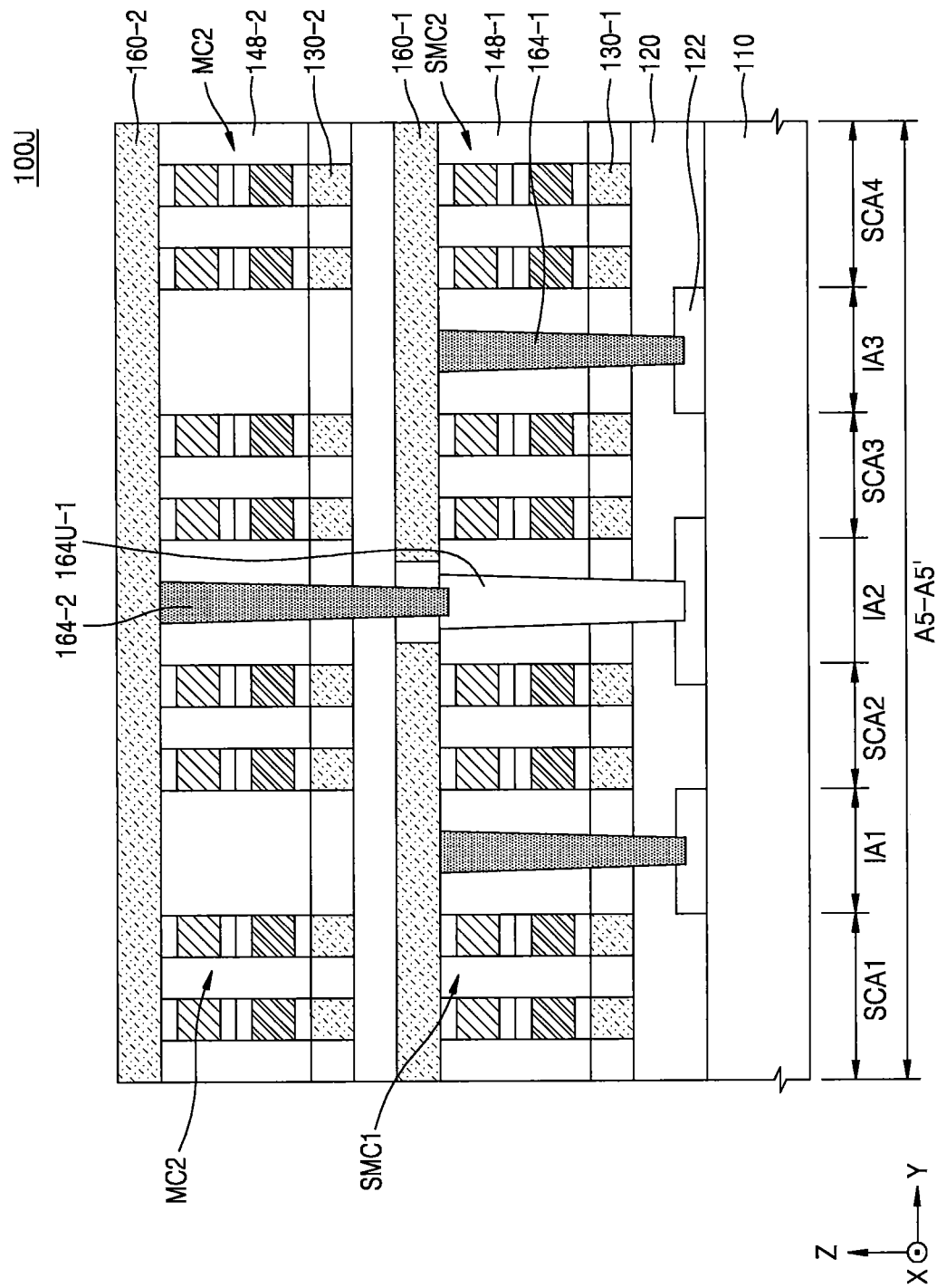
FIG. 18 is a cross-sectional view illustrating a memory device according to exemplary embodiments.

FIG. 18 is a cross-sectional view illustrating a memory device 100J according to exemplary embodiments. FIG. 18 illustrates a cross-sectional surface corresponding to a cross-sectional surface taken along line A5-A5' of FIG. 16.

Referring to FIG. 18, a stud 164U-1 including a conductive material may be disposed under a second bit line contact 164-2 and may be connected to a lower wiring layer 122. For example, in a process of forming a first bit line contact 164-1, the stud 164U-1 may be first formed, and then, the second bit line contact 164-2 connected to an upper surface of the stud 164U-1 may be formed. According to the above-described embodiment, even when a height of the memory device 100J is large, a process of etching and burying a contact hole for forming the second bit line contact 164-2 may be precisely controlled.

Figure 19:
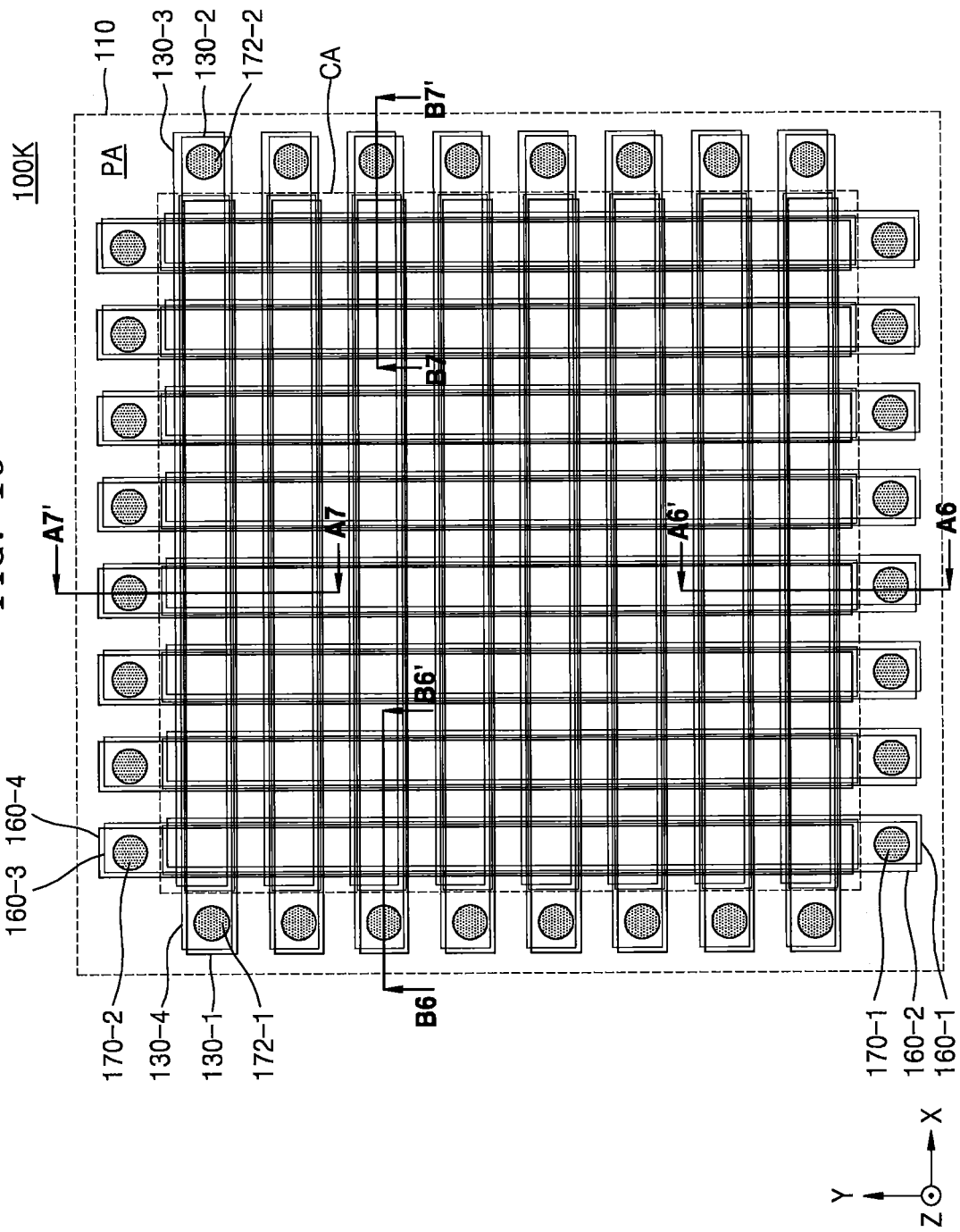
FIG. 19 is a layout diagram illustrating a representative configuration of a memory device according to exemplary embodiments.
Figure 20:
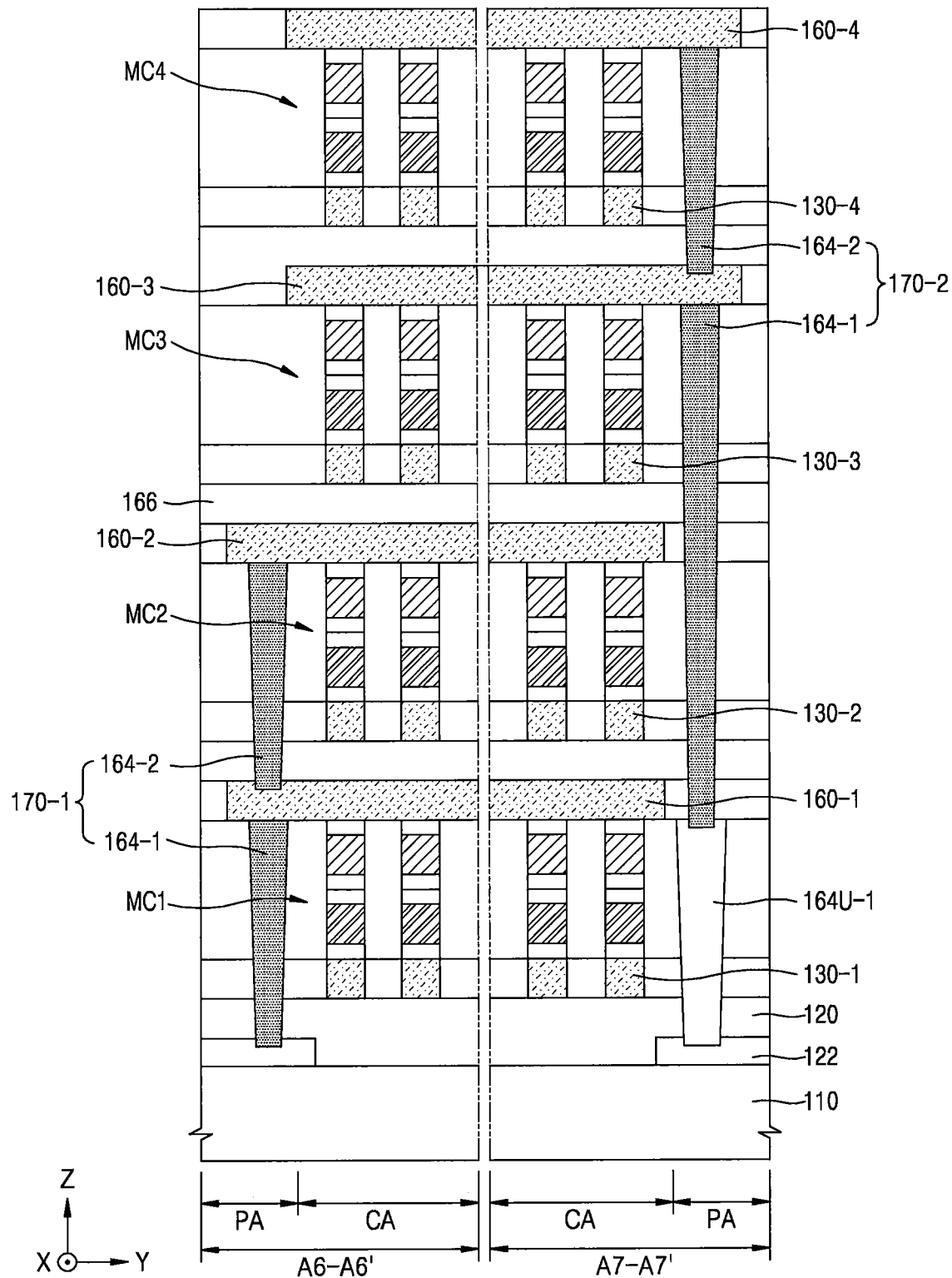
FIG. 20 is cross-sectional views taken along lines A6-A6' and A7-A7' of FIG. 19.
Figure 21:
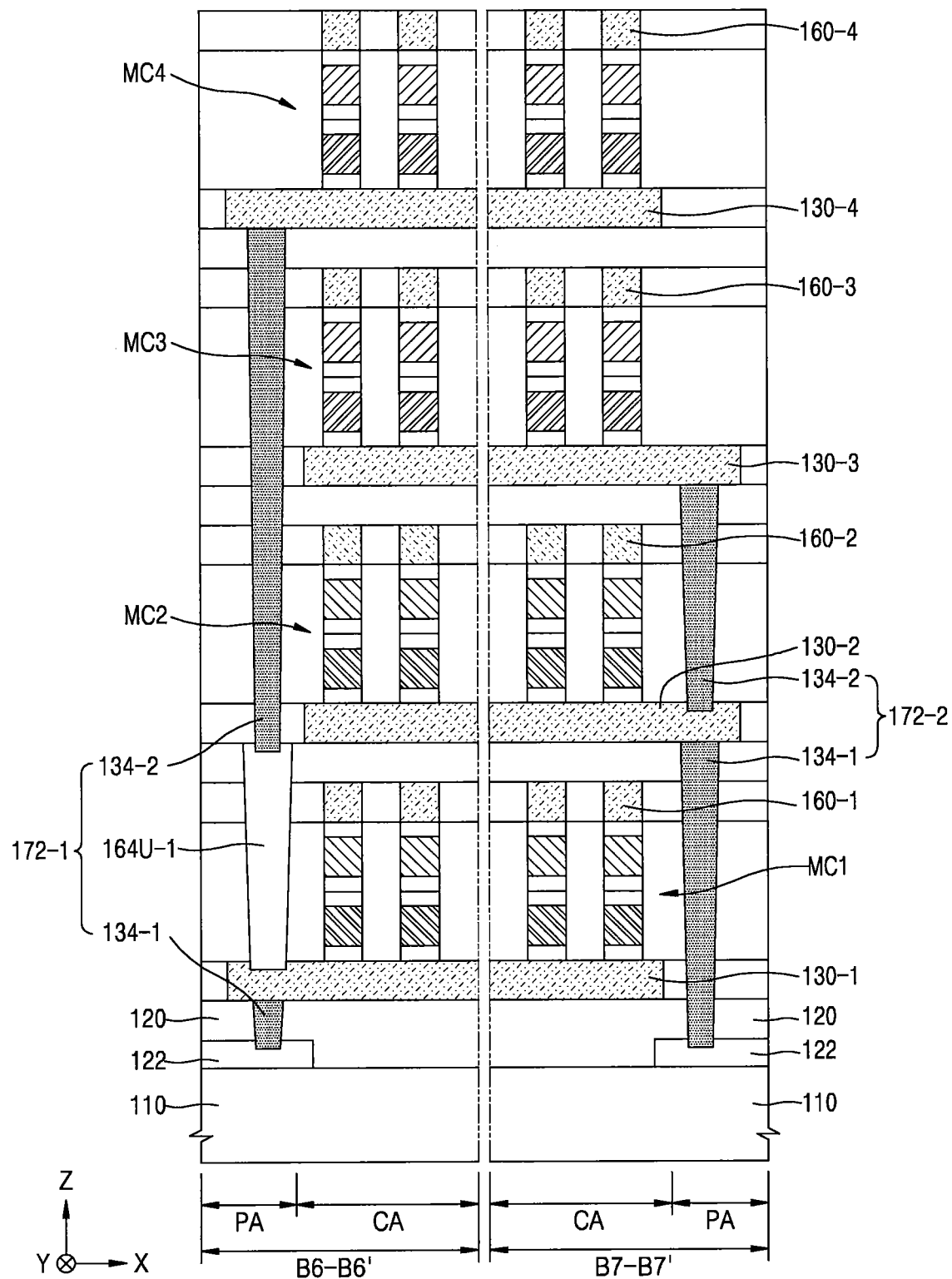
FIG. 21 is cross-sectional views taken along lines B6-B6' and B7-B7' of FIG. 19.

FIG. 19 is a layout diagram illustrating a representative configuration of a memory device 100K according to exemplary embodiments. FIG. 20 is cross-sectional views taken along lines A6-A6' and A7-A7' of FIG. 19. FIG. 21 is cross-sectional views taken along lines B6-B6' and B7-B7' of FIG. 19.

Referring to FIGS. 19 to 21, the memory device 100K may include a plurality of third word lines 130-3, a plurality of third memory cells MC3, a plurality of third bit lines 160-3, a plurality of fourth word lines 130-4, a plurality of fourth memory cells MC4, and a plurality of fourth bit lines 160-4, which are sequentially disposed on a third insulating interlayer 166. A structure of each of the plurality of third memory cells MC3 and the plurality of fourth memory cells MC4 may refer to the descriptions of the plurality of first memory cells MC1 and the plurality of second memory cells MC2.

The plurality of third bit lines 160-3 may be electrically connected to the plurality of fourth bit lines 160-4 by a plurality of second bit line connection structures 170-2, the plurality of first word lines 130-1 may be electrically connected to the plurality of fourth word lines 130-4 by a plurality of first word line connection structures 172-1, and the plurality of second word lines 130-2 may be electrically connected to the plurality of third word lines 130-3 by a plurality of second word line connection structures 172-2.

FIGS. 22 to 26 are cross-sectional views illustrating a method of manufacturing a memory device according to exemplary embodiments. In FIGS. 22 to 26, cross-sectional surfaces corresponding to cross-sectional surfaces taken along lines A1-A1' and B1-B1' of FIG. 2 are illustrated in a process order.

Figure 22:
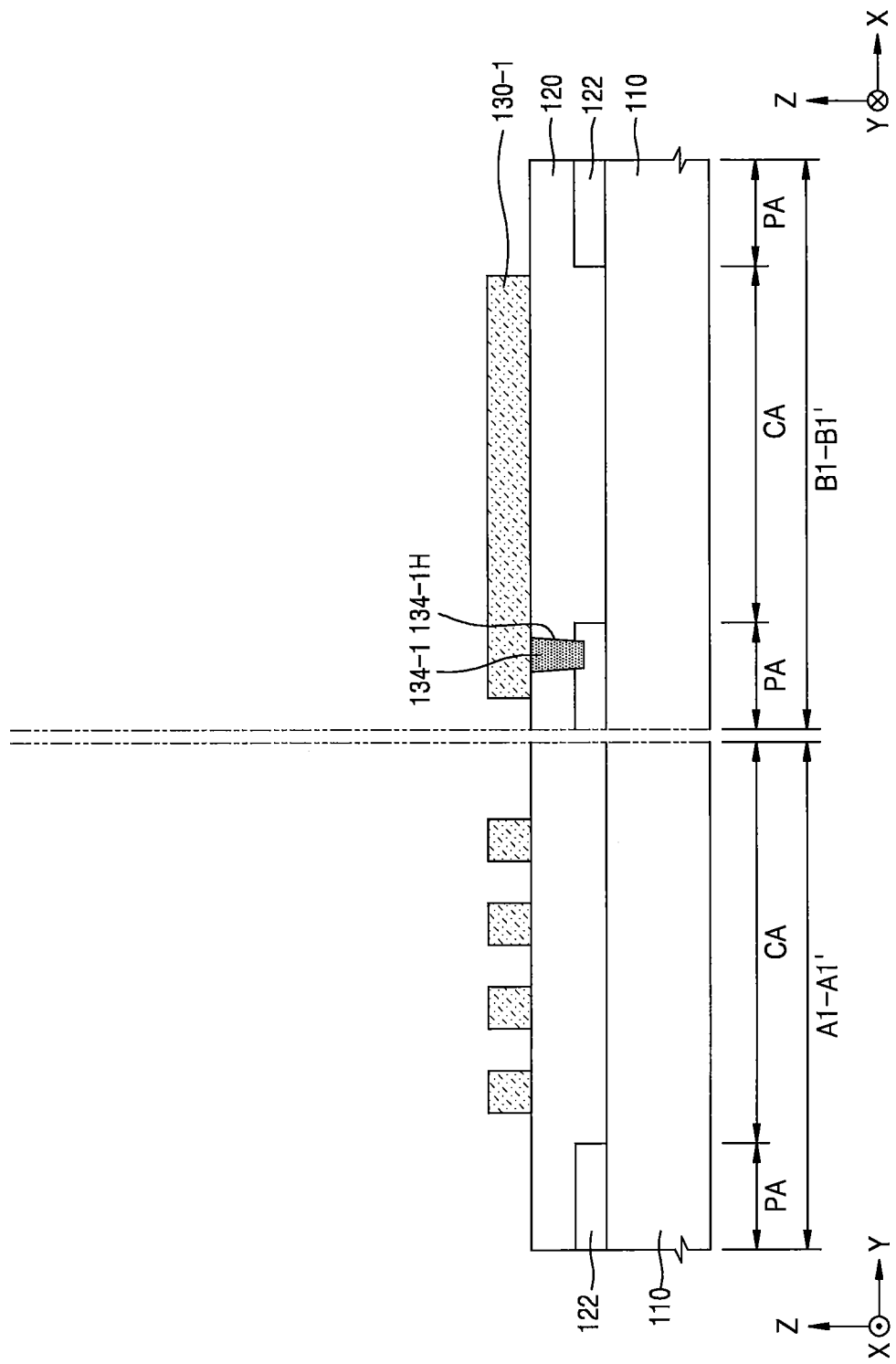
FIGS. 22 to 26 are cross-sectional views illustrating methods of manufacturing a memory device according to exemplary embodiments.

Referring to FIG. 22, a conductive layer (not shown) may be formed on a substrate 110, and a lower wiring layer 122 may be formed by patterning the conductive layer. Subsequently, a first insulating interlayer 120 covering the lower wiring layer 122 may be formed on the substrate 110.

A mask pattern (not shown) may be formed on the first insulating interlayer 120, a contact hole 134-1H exposing an upper surface of the lower wiring layer 122 may be formed by using the mask pattern as an etch mask, and a first word line contact 134-1 filling the contact hole 134-1H may be formed.

Subsequently, a conductive layer (not shown) may be formed on the first insulating interlayer 120, and a plurality of first word lines 130-1 may be formed by patterning the conductive layer.

Figure 23:
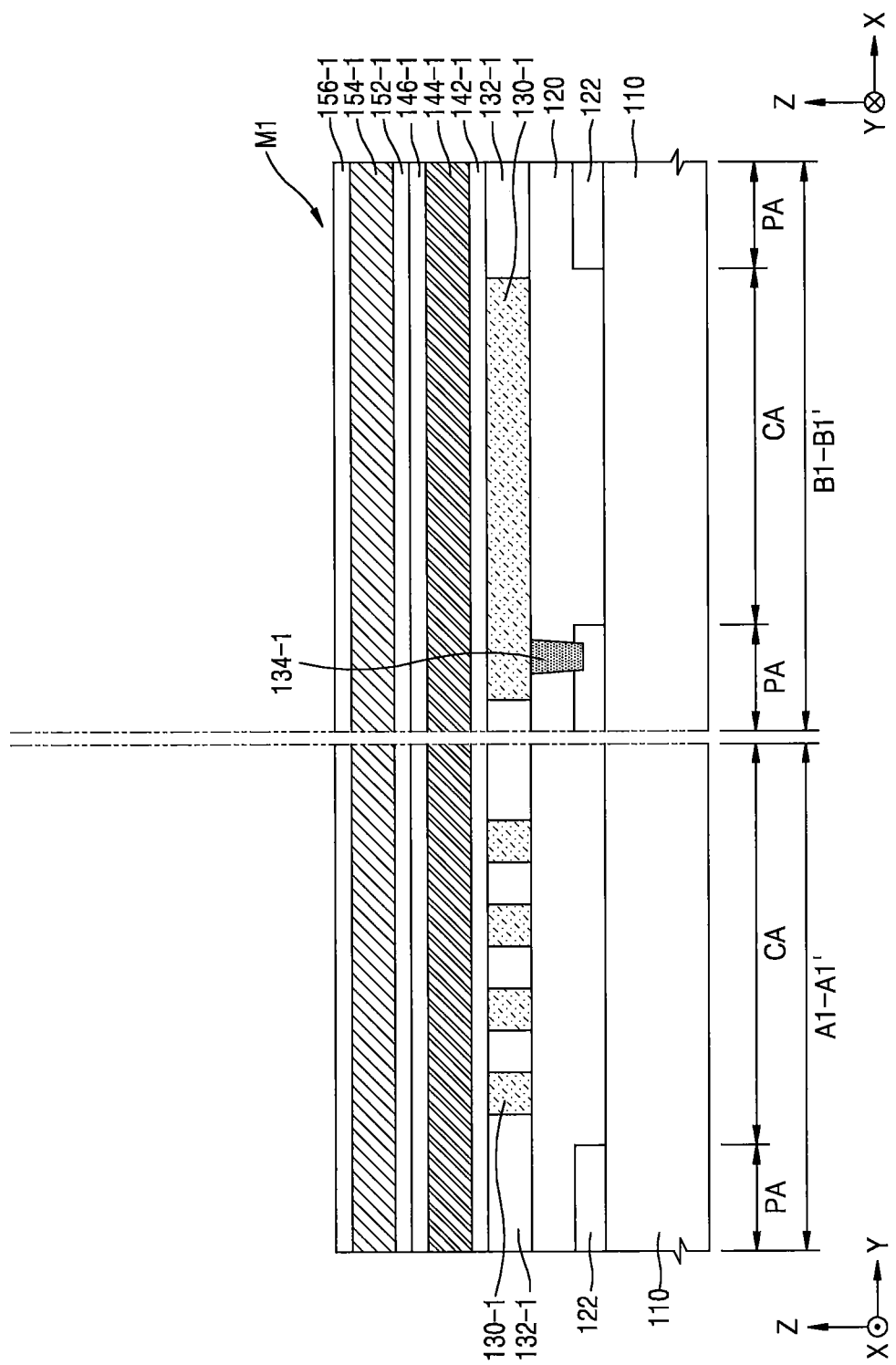

Referring to FIG. 23, an insulation layer (not shown) may be formed on the plurality of first word lines 130-1 and the first insulating interlayer 120, and a first insulation layer 132-1 may be formed by planarizing an upper surface of the insulation layer until upper surfaces of the plurality of first word lines 130-1 are exposed.

A first memory stack M1 may be formed by forming a first electrode layer 142-1, a first switching material layer 144-1, a second electrode layer 146-1, a third electrode layer 152-1, a first variable resistance layer 154-1, and a fourth electrode layer 156-1 on the plurality of first word lines 130-1 and the first insulation layer 132-1.

Figure 24:
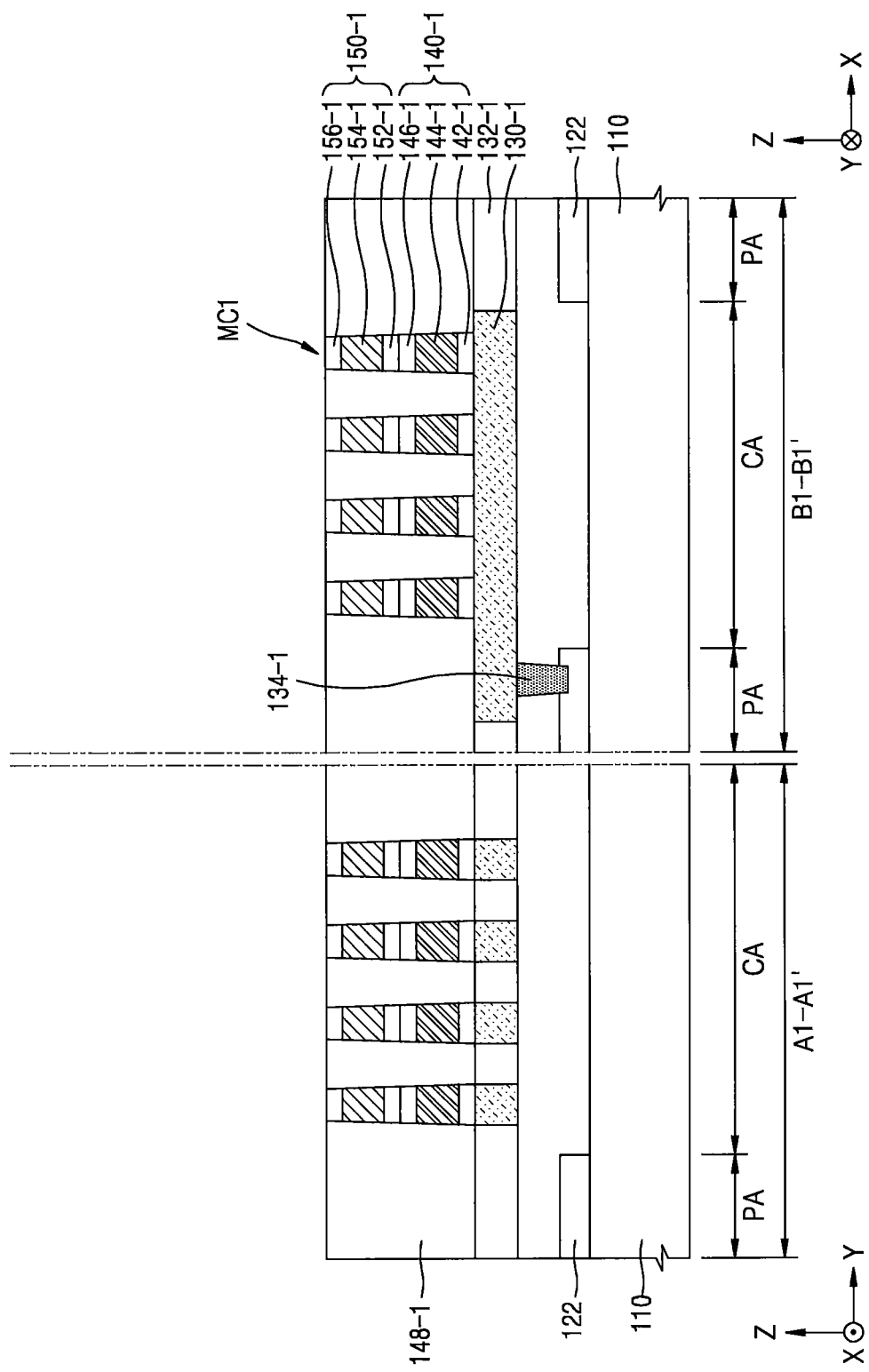

Referring to FIG. 24, a mask pattern (not shown) may be formed on the first memory stack M1 (see FIG. 23), and a plurality of first memory cells MC1 may be formed by patterning the first memory stack M1 with the mask pattern as an etch mask. Subsequently, an insulation layer (not shown) which fills a space between the plurality of first memory cells MC1 may be formed, and then, a second insulation layer 148-1 may be formed by planarizing an upper surface of the insulation layer until upper surfaces of the plurality of first memory cells MC1 are exposed.

In an exemplary process, the patterning process may be performed by using, as an etch mask, a plurality of island patterns which are arranged in a first direction (an X direction) and a second direction (a Y direction) and are spaced apart from each other. In another exemplary process, the patterning process may include a first patterning process, where a plurality of line patterns extending in the first direction are used as an etch mask, and a second patterning process which follows the first patterning process and uses, as an etch mask, a plurality of line patterns which are arranged in the second direction and are spaced apart from each other.

Figure 25:
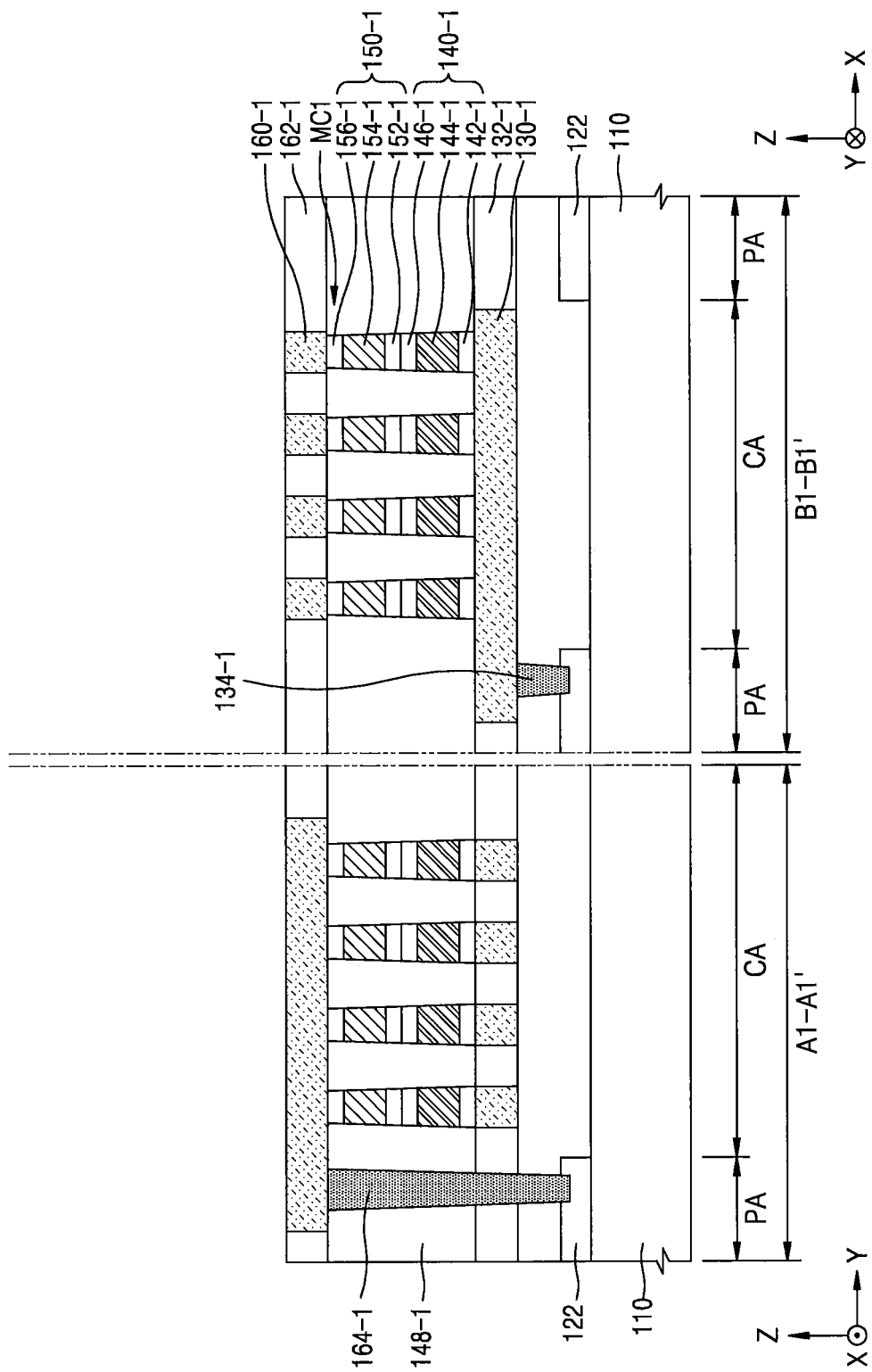

Referring to FIG. 25, a contact hole (not shown) which passes through the second insulation layer 148-1, the first insulation layer 132-1, and the first insulating interlayer 120 to expose an upper surface of the lower wiring layer 122 may be formed, and a first bit line contact 164-1 filling the contact hole may be formed.

Subsequently, a conductive layer (not shown) may be formed on the second insulation layer 148-1 and the first memory cell MC1, and a plurality of first bit lines 160-1 may be formed by patterning the conductive layer. An insulation layer (not shown) may be formed on the plurality of first bit lines 160-1 and the second insulation layer 148-1, and a third insulation layer 162-1 may be formed by planarizing an upper surface of the insulation layer until upper surfaces of the plurality of first bit lines 160-1 are exposed.

Figure 26:
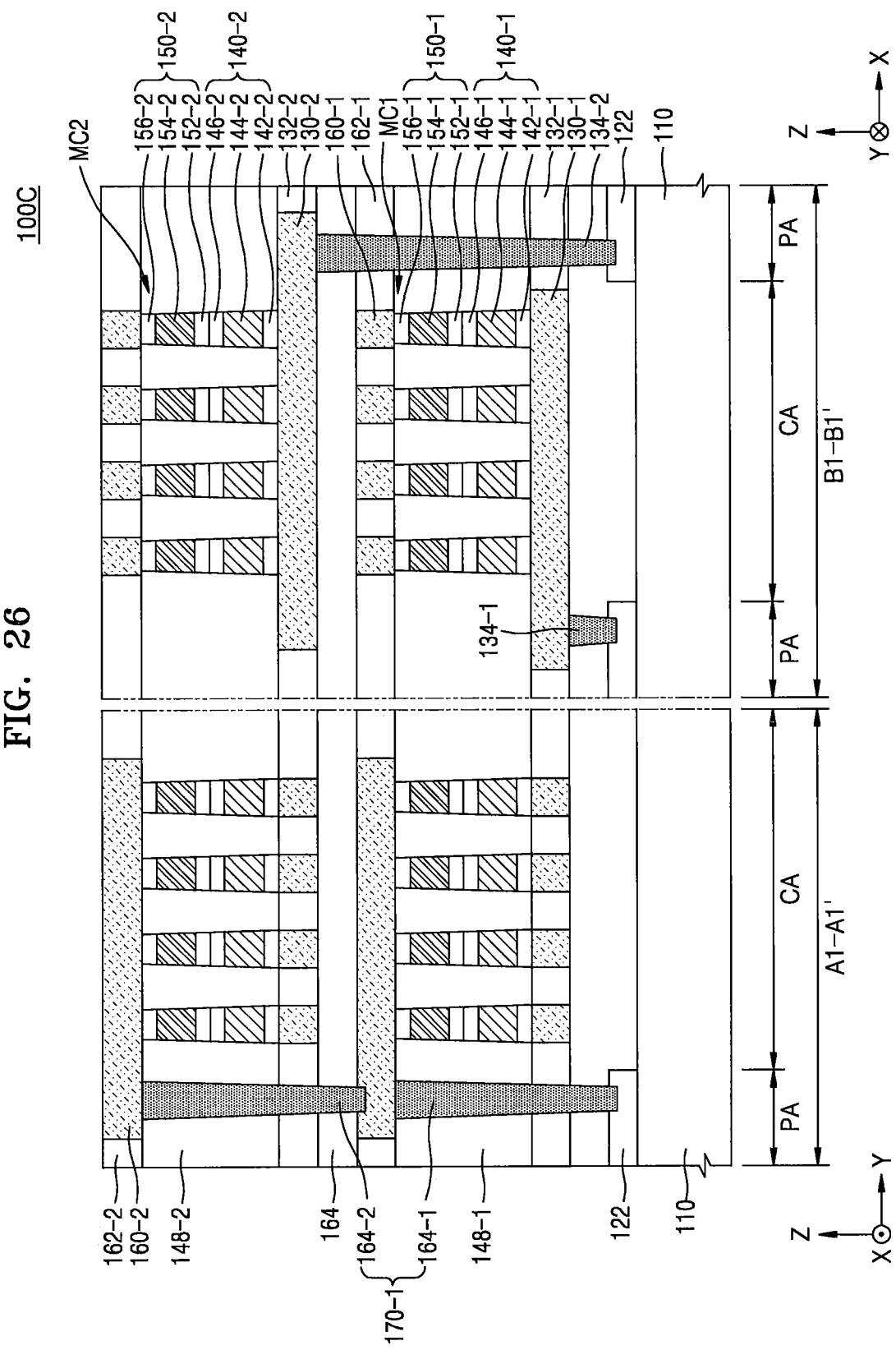

Referring to FIG. 26, a second insulating interlayer 164 may be formed on the plurality of first bit lines 160-1 and the third insulation layer 162-1. Subsequently, a contact hole (not shown) which passes through the second insulating interlayer 164, the third insulation layer 162-1, the second insulation layer 148-1, the first insulation layer 132-1, and the first insulating interlayer 120 to expose the upper surface of the lower wiring layer 122 may be formed, and a second word line contact 134-2 filling the contact hole may be formed.

Subsequently, a plurality of second word lines 130-2, a fourth insulation layer 132-2, a plurality of second memory cells MC2, and a fifth insulation layer 148-2 may be formed by performing a process similar to the process described above with reference to FIGS. 22 to 25.

Subsequently, a contact hole (not shown) which passes through the fifth insulation layer 148-2, the fourth insulation layer 132-2, and the second insulating interlayer 164 to expose upper surfaces of the plurality of first bit lines 160-1 may be formed, and a second bit line contact 164-2 filling the contact hole may be formed.

A conductive layer (not shown) may be formed on the fifth insulation layer 148-2 and the second memory cell MC2, and a plurality of second bit lines 160-2 may be formed by patterning the conductive layer. An insulation layer (not shown) may be formed on the plurality of second bit lines 160-2 and the fifth insulation layer 148-2, and a sixth insulation layer 162-2 may be formed by planarizing an upper surface of the insulation layer until upper surfaces of the plurality of second bit lines 160-2 are exposed.

The memory device 100C may be finished by the above-described process.

In a method of manufacturing the memory device 100C according to exemplary embodiments, the second memory cell MC2 may be formed by using process conditions which are substantially the same as those of a process of forming the first memory cell MC1. Therefore, a structure or a cross-sectional shape of the first memory cell MC1 may be substantially the same as a structure or a cross-sectional shape of the second memory cell MC2, and the occurrence of an electrical characteristic difference between the first memory cell MC1 and the second memory cell MC2 is prevented.

While the inventive concept has been particularly shown and described with reference to embodiments thereof, it will be understood that various changes in form and details may be made therein without departing from the spirit and scope of the following claims.

What is claimed is:

1. A memory device comprising:
a first word line on a substrate;
a first bit line on the first word line;

a second word line on the first bit line;

a second bit line on the second word line, and configured so that at least a portion of the second word line extends between the first and second bit lines;

a first memory cell extending between the first word line and the first bit line;

a second memory cell extending between the second word line and the second bit line; and a first bit line connection structure comprising a first bit line contact, which is connected to the first bit line, and a second bit line contact, which is connected to the second bit line and vertically overlaps the first bit line contact.

2. The memory device of claim 1, wherein said first memory cell comprises a first memory unit and a first switching unit, which extend in series between the first word line and the first bit line; and wherein the second memory cell comprises a second memory unit and a second switching unit, which extend in series between the second word line and the second bit line.

3. The memory device of claim 2, wherein said first and second memory cells are first and second nonvolatile memory cells, respectively.

4. The memory device of claim 2, wherein said first and second word lines extend in first directions across the substrate; and wherein said first and second bit line extend in a second direction across the substrate, which is generally perpendicular to the first direction.

5. The memory device of claim 4, wherein the first and second bit line contacts are vertically aligned with each other.

6. The memory device of claim 2, wherein the first switching unit is disposed on the first word line and the first memory unit extends between the first switching unit and the first bit line; and wherein the second switching unit is disposed on the second word line and the second memory unit extends between the second switching unit and the second bit line.

7. The memory device of claim 2, wherein the first memory unit is disposed on the first word line and the first switching unit extends between the first memory unit and the first bit line; and wherein the second memory unit is disposed on the second word line and the second switching unit extends between the second memory unit and the second bit line.

8. The memory device of claim 2, wherein the first memory unit comprises a first heating electrode having an L-shaped cross-section, and a first variable resistance layer disposed on the first heating electrode; and wherein the second memory unit comprises a second heating electrode having an L-shaped cross-section, and a second variable resistance layer disposed on the second heating electrode.

9. The memory device of claim 2, wherein the first memory unit comprises a first variable resistance layer and a first spacer disposed on a sidewall of the first variable resistance layer; wherein the second memory unit comprises a second variable resistance layer and a second spacer disposed on a sidewall of the second variable resistance layer; and wherein a width of an upper surface of the first variable resistance layer is substantially the same as a width of an upper surface of the second variable resistance layer.

10. The memory device of claim 1, wherein the first bit line contact extends between the substrate and the first bit line, and the second bit line contact extends between the first bit line and the second bit line.

11. The memory device of claim 1, wherein the first bit line contact extends between the first bit line and the second bit line, and the second bit line contact is disposed on the second bit line.

12. A memory device comprising:

a plurality of first word lines extending in a first direction on a substrate;

a plurality of first bit lines on the plurality of first word lines, the plurality of first bit lines extending in a second direction perpendicular to the first direction;

a plurality of first memory cells extending between the plurality of first word lines and the plurality of first bit lines, the plurality of first memory cells each including a first memory unit and a first switching unit;

a plurality of second word lines on the plurality of first bit lines, the plurality of second word lines extending in the first direction;

a plurality of second bit lines on the plurality of second word lines, the plurality of second bit lines extending in the second direction;

a plurality of second memory cells extending between the plurality of second word lines and the plurality of second bit lines, the plurality of second memory cells each including a second memory unit and a second switching unit; and a plurality of first bit line connection structures electrically connected to the plurality of first bit lines and the plurality of second bit lines, said plurality of first bit line connection structures configured so that at least a portion of each of said plurality of first bit line connection structures extends between a corresponding first bit line of the plurality of first bit lines and a corresponding second bit line of the plurality of second bit lines.

13. The memory device of claim 12, wherein each of the plurality of first bit line connection structures comprises:

a first bit line contact, which is connected to a corresponding first bit line of the plurality of first bit lines; and a second bit line contact, which is connected to a corresponding second bit line of the plurality of second bit lines and vertically overlaps the first bit line contact.

14. The memory device of claim 13, wherein each first bit line contact is disposed between a corresponding one of the plurality of first bit lines and the substrate; and wherein the second bit line contacts are disposed between the plurality of first bit lines and the plurality of second bit lines.

15. The memory device of claim 13, wherein the first bit line contacts are disposed between the plurality of first bit lines and the plurality of second bit lines, and the second bit line contacts are disposed on the plurality of second bit lines.

16. The memory device of claim 12, wherein the substrate comprises a memory cell array region and a wiring connection region, which surrounds the periphery of the memory cell array region; wherein the plurality of first memory cells and the plurality of second memory cells are disposed opposite the memory cell array region; and wherein the plurality of first bit line connection structures are disposed opposite the wiring connection region.

17. The memory device of claim 12, wherein the substrate comprises a memory cell array region and a wiring connection region surrounding a periphery of the memory cell array region; wherein the plurality of first memory cells and the plurality of second memory cells are disposed opposite the memory cell array region; and wherein the plurality of first bit line connection structures are disposed opposite the memory cell array region.

18. The memory device of claim 12, further comprising:
a plurality of third word lines on the plurality of second bit lines, the plurality of third word lines extending in the first direction;
a plurality of third bit lines on the plurality of third word lines, the plurality of third bit lines extending in the second direction;
a plurality of third memory cells between the plurality of third word lines and the plurality of third bit lines, the plurality of third memory cells each including a third memory unit and a third switching unit;
a plurality of fourth word lines on the plurality of third bit lines, the plurality of fourth word lines extending in the first direction;
a plurality of fourth bit lines on the plurality of fourth word lines, the plurality of fourth bit lines extending in the second direction;
a plurality of fourth memory cells between the plurality of fourth word lines and the plurality of fourth bit lines, the plurality of fourth memory cells each including a fourth memory unit and a fourth switching unit; and
a plurality of second bit line connection structures electrically connected to the plurality of third bit lines and the plurality of fourth bit lines, the plurality of second bit line connection structures being each disposed between a corresponding third bit line of the plurality of third bit lines and a corresponding fourth bit line of the plurality of fourth bit lines.

19. The memory device of claim 18, wherein the plurality of second bit line connection structures each comprises:
a third bit line contact connected to a corresponding third bit line of the plurality of third bit lines; and
a fourth bit line contact connected to a corresponding fourth bit line of the plurality of fourth bit lines and disposed to vertically overlap the third bit line contact.

20. A memory device comprising:
a first word line extending in a first direction on a substrate;
a first bit line on the first word line, the first bit line extending in a second direction perpendicular to the first direction;
a first memory cell between the first word line and the first bit line, the first memory cell including a first memory unit and a first switching unit;
a second word line on the first bit line, the second word line extending in the first direction;
a second bit line on the second word line, the second bit line extending in the second direction and configured so that at least a portion of the second word line extends between the first and second bit lines;
a second memory cell between the second word line and the second bit line, the second memory cell including a second memory unit and a second switching unit; and
a first bit line connection structure including a first bit line contact extending between the substrate and the first bit line, and a second bit line contact disposed between the first bit line and the second bit line and vertically overlapping the first bit line contact.

* * * * *